US012765201B2

(12) United States Patent
Lee et al.

(10) Patent No.: US 12,765,201 B2
(45) Date of Patent: Oct. 13, 2026

(54) DISPLAY APPARATUS

(71) Applicant: Samsung Display Co., Ltd., Yongin-si (KR)

(72) Inventors: Jaewoo Lee, Yongin-si (KR); Taeho Kim, Yongin-si (KR); Seungjun Lee, Yongin-si (KR); Yongsu Lee, Yongin-si (KR); Seunghwan Cho, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 332 days.

(21) Appl. No.: 18/642,414

(22) Filed: Apr. 22, 2024

(65) Prior Publication Data

US 2024/0373698 A1 Nov. 7, 2024

(30) Foreign Application Priority Data

May 3, 2023 (KR) ........................ 10-2023-0057944
Jun. 16, 2023 (KR) ........................ 10-2023-0077716

(51) Int. Cl.
*H10K 59/131* (2023.01)

(52) U.S. Cl.
CPC .................................. *H10K 59/131* (2023.02)

(58) Field of Classification Search
CPC .... H10K 59/131; H10K 59/40; H10K 59/126; H10K 59/353; H10K 59/124
USPC ............................................................ 257/40
See application file for complete search history.

(56) References Cited

U.S. PATENT DOCUMENTS

| | | | | |
|---|---|---|---|---|
| 10,497,316 | B2 | 12/2019 | Wang et al. | |
| 11,176,883 | B2 | 11/2021 | Na et al. | |
| 11,233,104 | B2 | 1/2022 | Park et al. | |
| 11,482,591 | B2 | 10/2022 | Cho et al. | |
| 11,580,914 | B2 | 2/2023 | Cho et al. | |
| 11,600,675 | B2 | 3/2023 | Kim et al. | |
| 11,631,729 | B2 | 4/2023 | Lee et al. | |
| 2006/0044237 | A1* | 3/2006 | Lee | G09G 3/3233 345/82 |

(Continued)

FOREIGN PATENT DOCUMENTS

| | | | |
|---|---|---|---|
| KR | 10-2020-0010697 A | | 1/2020 |
| KR | 10-2020-0064230 A | | 6/2020 |

(Continued)

*Primary Examiner* — Duy T Nguyen
(74) *Attorney, Agent, or Firm* — Womble Bond Dickinson (US) LLP

(57) ABSTRACT

A display apparatus includes: a common voltage supply line on a peripheral area; a vertical common voltage line extending in a first direction on a display area, and electrically connected to the common voltage supply line; a horizontal common voltage line extending in a second direction on the display area, and electrically connected to the common voltage supply line; a data input line on the peripheral area; a data line on the display area; a connection line on the display area, connecting the data input line to the data line, and including: a vertical connection portion extending in the first direction; and a horizontal connection portion extending in the second direction; and a first conductive pattern at the same layer as the horizontal common voltage line, spaced from the horizontal connection portion, and connected to the vertical common voltage line crossing the horizontal connection portion through a contact hole.

24 Claims, 18 Drawing Sheets

(56) References Cited

U.S. PATENT DOCUMENTS

| | | | | |
|---|---|---|---|---|
| 2019/0278145 | A1* | 9/2019 | Tanaka | G02F 1/136286 |
| 2020/0202784 | A1* | 6/2020 | Kim | G09G 3/3233 |
| 2020/0335025 | A1* | 10/2020 | Kim | G09G 3/20 |
| 2021/0201795 | A1* | 7/2021 | Cho | G09G 3/3233 |
| 2021/0273035 | A1 | 9/2021 | Cho et al. | |
| 2022/0320253 | A1 | 10/2022 | Cho et al. | |
| 2022/0336563 | A1 | 10/2022 | Cho et al. | |
| 2022/0336565 | A1 | 10/2022 | Cho et al. | |

FOREIGN PATENT DOCUMENTS

| | | | |
|---|---|---|---|
| KR | 10-2021-0018673 | A | 2/2021 |
| KR | 10-2021-0053381 | A | 5/2021 |
| KR | 10-2021-0105462 | A | 8/2021 |
| KR | 10-2021-0137336 | A | 11/2021 |
| KR | 10-2323292 | B1 | 11/2021 |
| KR | 10-2021-0148547 | A | 12/2021 |
| KR | 10-2022-0138917 | A | 10/2022 |
| KR | 10-2022-0144451 | A | 10/2022 |
| KR | 10-2022-0145937 | A | 10/2022 |

* cited by examiner

DISPLAY APPARATUS

CROSS-REFERENCE TO RELATED APPLICATION

The present application claims priority to and the benefit of Korean Patent Application No. 10-2023-0057944, filed on May 3, 2023, and Korean Patent Application No. 10-2023-0077716, filed on Jun. 16, 2023, in the Korean Intellectual Property Office, the entire disclosures of all of which are incorporated by reference herein.

BACKGROUND

1. Field

Aspects of one or more embodiments of the present disclosure relate to a display apparatus.

2. Description of Related Art

Generally, in a display apparatus, such as an organic light-emitting display apparatus, thin-film transistors are disposed in a display area to control the luminance or the like of a light-emitting diode. The thin-film transistors are controlled to emit light beams having predetermined colors from light-emitting diodes corresponding to the thin-film transistors by using received data signals, received driving voltages, and received common voltages.

A data driving circuit, a driving voltage supply line, a common voltage supply line, and the like are positioned in a peripheral area outside the display area to provide a data signal, a driving voltage, a common voltage, and the like.

The above information disclosed in this Background section is for enhancement of understanding of the background of the present disclosure, and therefore, it may contain information that does not constitute prior art.

SUMMARY

One or more embodiments of the present disclosure are directed to a display apparatus having an improvement in display quality by reducing a difference in visibility between areas in a display area for providing an image. However, the aspects and features of the present disclosure are not limited to the above aspects and features.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including a display area, and a peripheral area outside the display area; a common voltage supply line on the peripheral area, and surrounding at least a portion of the display area; vertical common voltage lines, each extending in a first direction on the display area, and electrically connected to the common voltage supply line; horizontal common voltage lines, each extending in a second direction crossing the first direction on the display area, and electrically connected to the common voltage supply line; data input lines on the peripheral area; data lines, each extending in the first direction on the display area, and located along the second direction; connection lines on the display area, and connecting the data input lines to the data lines, respectively, each of the connection lines including: a vertical connection portion extending in the first direction; and a horizontal connection portion extending in the second direction; and a first conductive pattern at the same layer as that of the horizontal common voltage lines, the first conductive pattern being spaced from the horizontal connection portion of a first connection line from among the connection lines, and connected to a first vertical common voltage line crossing the horizontal connection portion of the first connection line from among the vertical common voltage lines through a contact hole.

In an embodiment, the first conductive pattern may be located adjacent to a crossing area between the horizontal connection portion of the first connection line and the first vertical common voltage line.

In an embodiment, the first conductive pattern may be located at the same layer as that of the horizontal connection portion of the first connection line.

In an embodiment, the first conductive pattern may be electrically insulated from the first connection line.

In an embodiment, a first horizontal common voltage line from among the horizontal common voltage lines may include: a first portion extending in the second direction; and a second portion protruding in the first direction from the first portion of the first horizontal common voltage line; and the second portion of the first horizontal common voltage line may be connected to a second vertical common voltage line from among the vertical common voltage lines through a contact hole.

In an embodiment, the second portion of the first horizontal common voltage line may include: a contact portion connected to the second vertical common voltage line; and a connection portion connecting the contact portion to the first portion of the first horizontal common voltage line.

In an embodiment, a distance between the horizontal connection portion of the first connection line and the first conductive pattern may be substantially equal to a distance between the first portion of the first horizontal common voltage line and the contact portion of the first horizontal common voltage line.

In an embodiment, the display apparatus may further include a second conductive pattern adjacent to a portion at which the first horizontal common voltage line and a third vertical common voltage line adjacent to the second vertical common voltage line from among the vertical common voltage lines cross each other, the second conductive pattern being located at the same layer as that of the horizontal common voltage lines, and connected to the third vertical common voltage line through a contact hole.

In an embodiment, the second conductive pattern may be electrically insulated from the first horizontal common voltage line.

In an embodiment, a distance between the first portion of the first horizontal common voltage line and the second conductive pattern may be substantially equal to a distance between the first portion of the first horizontal common voltage line and the contact portion of the first horizontal common voltage line.

In an embodiment, the display apparatus may further include auxiliary horizontal common voltage lines, each extending in the second direction on the display area, and having lengths less than that of the horizontal common voltage lines.

In an embodiment, each of the auxiliary horizontal common voltage lines may include: a first portion extending in the second direction; and a second portion protruding in the first direction from the first portion of the auxiliary horizontal common voltage lines; and the second portion of one of the auxiliary horizontal common voltage lines may be connected to a fourth vertical common voltage line from among the vertical common voltage lines through a contact hole.

In an embodiment, the horizontal connection portion of a first connection line from among the connection lines may include: a first portion extending in the second direction; and a second portion on one end of the first portion of the horizontal connection portion and protruding in the first direction; and the second portion of the horizontal connection portion may be connected to one data line from among the data lines through a contact hole.

In an embodiment, the horizontal connection portion of the first connection line may further include a third portion on another end of the first portion, and protruding in the first direction; and the third portion of the horizontal connection portion may be connected to the vertical connection portion of the first connection line through a contact hole.

In an embodiment, the horizontal common voltage lines and the horizontal connection portions of the connection lines may be located at the same layer as each other.

In an embodiment, the common voltage supply line may include: a first common voltage input portion; a second common voltage input portion; and a third common voltage input portion between the first common voltage input portion and the second common voltage input portion. Each of the first, second, and third common voltage input portions may be located adjacent to a first edge of the display area.

According to one or more embodiments of the present disclosure, a display apparatus includes: a substrate including a display area, and a peripheral area outside the display area; a common voltage supply line on the peripheral area, and surrounding at least a portion of the display area; vertical common voltage lines, each extending in a first direction on the display area, and electrically connected to the common voltage supply line; horizontal common voltage lines, each extending in a second direction crossing the first direction on the display area, and electrically connected to the common voltage supply line; data input lines on the peripheral area; data lines, each extending in the first direction on the display area; and connection lines in the display area, and connecting the data input lines to the data lines, respectively, each of the connection lines including: a vertical connection portion extending in the first direction; and a horizontal connection portion extending in the second direction. The display area includes a first region where the vertical common voltage lines cross the horizontal common voltage lines, and a second region where the vertical common voltage lines cross the horizontal connection portions of the connection lines. The display apparatus further includes a first conductive pattern in the second region, electrically insulated from the connection lines, and connected to a first vertical common voltage line from among the vertical common voltage lines through a contact hole.

In an embodiment, a first horizontal common voltage line from among the horizontal common voltage lines located in the first region may include: a first portion extending in the second direction; and a second portion protruding in the first direction from the first portion of the first horizontal common voltage line; and the second portion of the first horizontal common voltage line may be connected to a second vertical common voltage line from among the vertical common voltage lines through a contact hole.

In an embodiment, the second portion of the first horizontal common voltage line may include: a contact portion connected to the second vertical common voltage line; and a connection portion connecting the contact portion to the first portion of the first horizontal common voltage line.

In an embodiment, the first conductive pattern may be adjacent to the horizontal connection portion of a first connection line from among the connection lines; and a distance between the horizontal connection portion of the first connection line and the first conductive pattern may be substantially equal to a distance between the first portion of the first horizontal common voltage line and the contact portion of the first horizontal common voltage line.

In an embodiment, the display area may further include a third region; the display apparatus may further include auxiliary horizontal common voltage lines, each extending in the second direction on the third region of the display area, and having lengths less than that of the horizontal common voltage lines; each of the auxiliary horizontal common voltage lines may include: a first portion extending in the second direction; and a second portion protruding in the first direction from the first portion of the auxiliary horizontal common voltage lines; and the second portion of one of the auxiliary horizontal common voltage lines may be connected to a third vertical common voltage line from among the vertical common voltage lines through a contact hole.

In an embodiment, the second portion of the one of the auxiliary horizontal common voltage lines may include: a contact portion connected to the third vertical common voltage line; and a connection portion connecting the contact portion to the first portion of the one of the auxiliary horizontal common voltage lines.

In an embodiment, the first conductive pattern may be adjacent to the horizontal connection portion of a first connection line from among the connection lines; and a distance between the horizontal connection portion of the first connection line and the first conductive pattern may be substantially equal to a distance between the first portion of the one of the auxiliary horizontal common voltage lines and the contact portion of the one of the auxiliary horizontal common voltage lines.

According to one or more embodiments of the present disclosure, a display apparatus includes: a substrate including a display area, and a peripheral area outside the display area; a common voltage supply line on the peripheral area, and surrounding at least a portion of the display area; a vertical common voltage line extending in a first direction on the display area, and electrically connected to the common voltage supply line; a horizontal common voltage line extending in a second direction crossing the first direction on the display area, and electrically connected to the common voltage supply line; a data line extending in the first direction on the display area; a connection line including: a horizontal connection portion on the display area, connected to the data line through a contact hole, and extending in the second direction; and a vertical connection portion connected to the horizontal connection portion through a contact hole, and extending in the first direction; and a conductive pattern spaced from the horizontal connection portion of the connection line, and connected to the vertical common voltage line through a contact hole. The horizontal common voltage line includes a contact portion connected to the vertical common voltage line by a contact hole, and a distance between the horizontal common voltage line and the contact portion is substantially equal to a distance between the horizontal connection portion and the conductive pattern.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
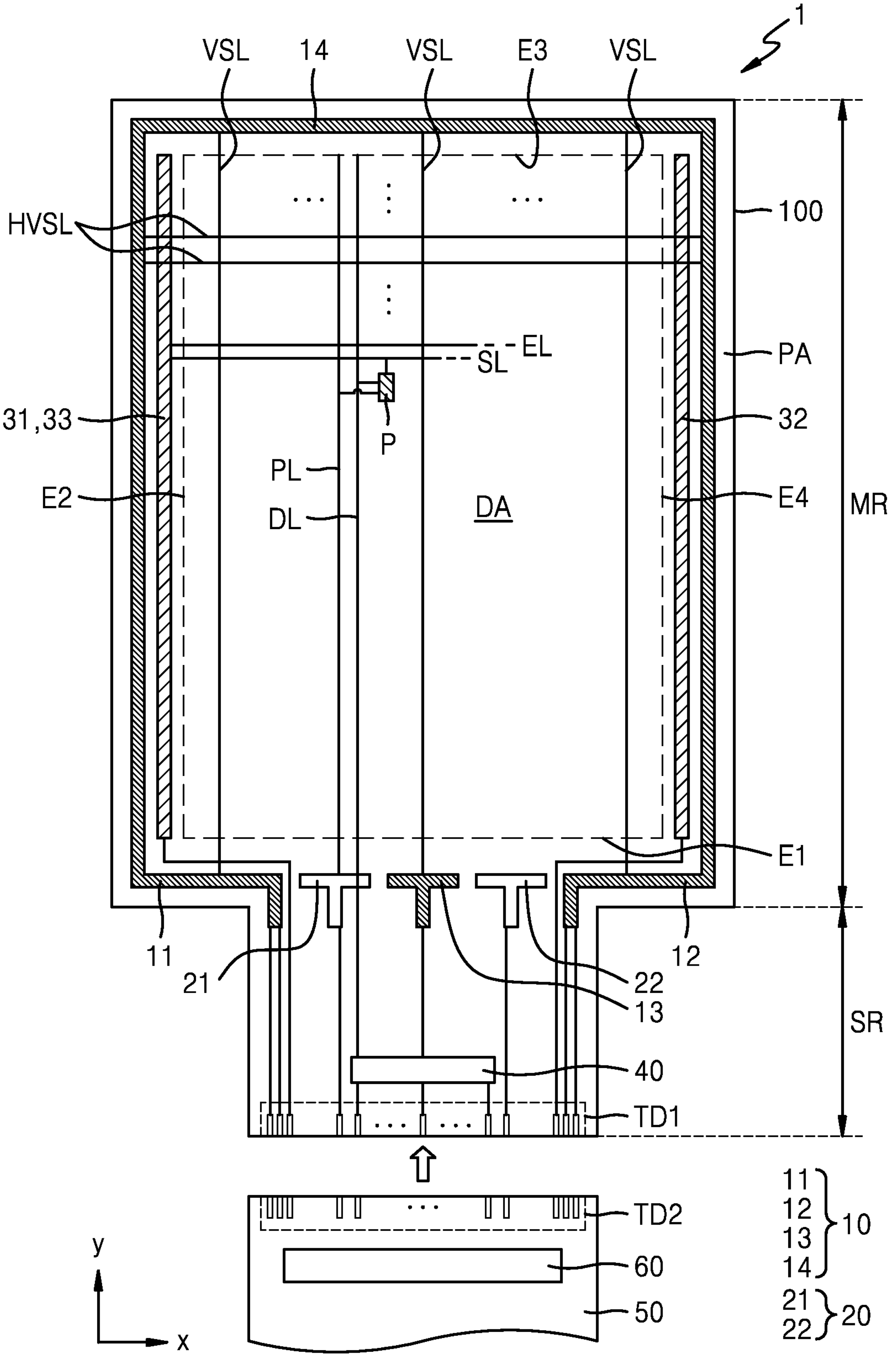
FIG. 1 is a schematic plan view of a portion of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
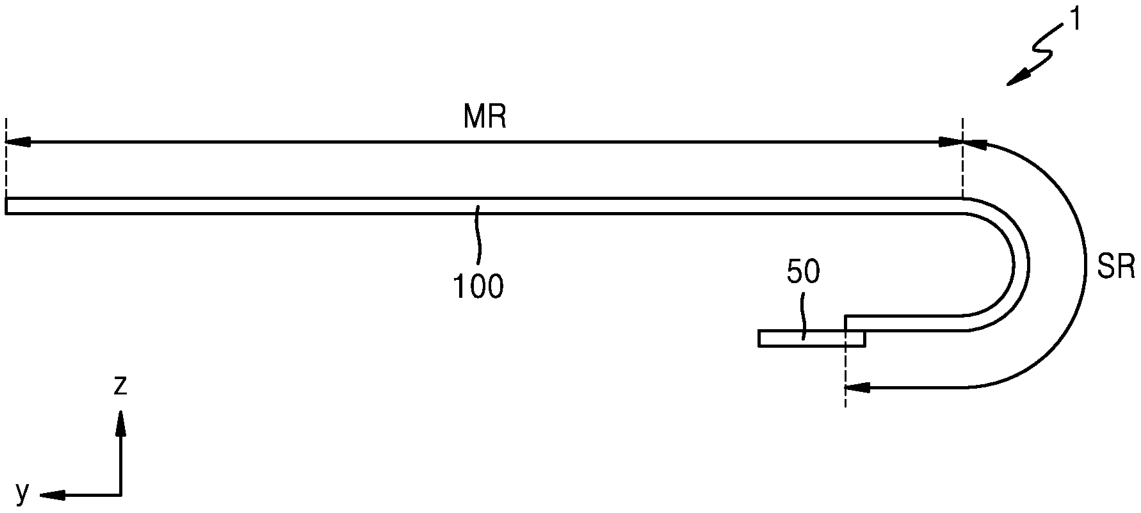
FIG. 2 is a schematic side view of the display apparatus of FIG. 1.

FIG. 1 is a schematic plan view of a portion of a display apparatus according to an embodiment, and FIG. 2 is a schematic side view of the display apparatus of FIG. 1.

Referring to FIGS. 1 and 2, the display apparatus includes a display panel 1. The display apparatus may be of any suitable kind of display apparatus, as long as it includes the display panel 1 described in more detail below. For example, the display apparatus may be any one of various suitable products, such as a smartphone, a tablet, a laptop, a television, or a billboard.

The display panel 1 includes a display area DA, and a peripheral area PA around (e.g., adjacent to) the display area DA. The display area DA is an area for displaying an image, and a plurality of pixels P may be disposed on the display area DA. When viewed in a direction perpendicular to or approximately perpendicular to the display apparatus 1 (e.g., in a plan view), the display area DA may have any of various suitable shapes, such as a circular shape, an oval shape, a polygonal shape, or a particular figure shape. FIG. 1 illustrates a case in which the display area DA is rectangular or approximately rectangular (e.g., having right-angled corners). However, the present disclosure is not limited thereto, and according to another embodiment, the display area DA may have the shape of a quadrangle having rounded corners.

The peripheral area PA may be disposed outside the display area DA. The peripheral area PA may entirely surround (e.g., around a periphery of) the display area DA. A portion (hereinafter, referred to as a protruding peripheral area) of the peripheral area PA may extend in a direction (e.g., −y direction) away from the display area DA. In other words, the display panel 1 may include a main region MR including the display area DA and a portion of the peripheral area PA surrounding (e.g., around a periphery of) the display area DA, and a sub region SR extending from the main area MR in one direction. The sub region SR may correspond to the protruding peripheral area. A width (e.g., in the x direction) of the subregion SR may be less than a width (e.g., in the x direction) of the main region MR, and a portion of the subregion SR may be bent as illustrated in FIG. 2. When the display panel 1 is bent as illustrated in FIG. 2, the peripheral area PA, which is a non-display area, may be prevented or substantially prevented from being visually recognized when the display apparatus is viewed, or even when the peripheral area PA is visually recognized, the visible area of the peripheral area PA may be minimized or reduced.

A shape of the display panel 1 may be the same or substantially the same as that of a substrate 100. For example, the substrate 100 may be considered as including the display area DA and the peripheral area PA. As another example, the substrate 100 may be considered as including the main region MR and the subregion SR.

The pixels P may be disposed on the display area DA, and each of the pixels P may emit red light, green light, or blue light. For example, the pixel P may emit light having a desired brightness (e.g., a predetermined brightness) by using a light-emitting diode to emit light. The light-emitting diode may be an organic light-emitting diode, an inorganic light-emitting diode, or a quantum dot light-emitting diode. For convenience, a case where the light-emitting diode is an organic light-emitting diode will be described in more detail hereinafter as a representative example.

The light-emitting diode may be connected to transistors connected to signal lines and/or voltage lines for controlling an on/off operation and the luminance of the light-emitting diode. In this regard, FIG. 1 shows a scan line SL, an emission control line EL, and a data line DL as the signal lines connected to the transistors, and a driving voltage line PL and a vertical common voltage line VSL as the voltage lines. In the peripheral area PA, a common voltage supply line 10, a driving voltage supply line 20, first and second scan driving circuits 31 and 32, an emission control driving circuit 33, and a data driving circuit 40 may be disposed.

The common voltage supply line 10 may be disposed on the peripheral area PA. The common voltage supply line 10 may include a first common voltage input unit (e.g., a first common voltage input line or portion) 11, a second common voltage input unit (e.g., a second common voltage input line or portion) 12, and a third common voltage input unit (e.g., a third common voltage input line or portion) 13 disposed to be adjacent to a first edge E1 of the display area DA. The first common voltage input unit 11 and the second common voltage input unit 12 may be spaced apart from each other, and the third common voltage input unit 13 may be located between the first common voltage input unit 11 and the second common voltage input unit 12. The third common voltage input unit 13 may be spaced apart from the first common voltage input unit 11 and the second common voltage input unit 12. The first common voltage input unit 11 and the second common voltage input unit 12 may be disposed at opposite ends of the first edge E1 of the display area DA, respectively, and the third common voltage input unit 13 may be disposed in the middle of the first edge E1 in the display area DA. Although the common voltage supply line 10 is illustrated as including the first common voltage input unit 11, the second common voltage input unit 12, and the third common voltage input unit 13, the present disclosure is not limited thereto. According to another embodiment, the third common voltage input unit 13 may be omitted as needed or desired, and the first common voltage input unit 11 and the second common voltage input unit 12 may be disposed.

The first common voltage input unit 11 and the second common voltage input unit 12 may be connected to each other by a body unit (e.g., a body line or portion) 14 extending along a second edge E2, a third edge E3, and a fourth edge E4 of the display area DA. In other words, the first common voltage input unit 11 and the second common voltage input unit 12 may be integrally formed with the body unit 14.

The common voltage supply line 10 may be electrically connected to the vertical common voltage lines VSL that traverse the display area DA. Some of the vertical common voltage lines VSL may extend from the first, second, and third common voltage input units 11, 12, and 13 toward the display area DA. Any one vertical common voltage line VSL may traverse the display area DA in a first direction (e.g., the y direction) to connect the third common voltage input unit 13 to a portion of the body unit 14 facing the third common voltage input unit 13. Another vertical common voltage line VSL may traverse the display area DA in the first direction (e.g., the y direction) to connect the first common voltage input unit 11 to a portion of the body unit 14 facing the first common voltage input unit 11. Similarly, another vertical common voltage line VSL may traverse the display area DA in the first direction (e.g., the y direction) to connect the second common voltage input unit 12 to a portion of the body unit 14 facing the second common voltage input unit 12. The vertical common voltage lines VSL, each extending in the first direction, may be electrically connected to a horizontal common voltage line HVSL extending in a second direction (e.g., the x direction) crossing or intersecting the first direction.

When the common voltage supply line 10 includes the third common voltage input unit 13 disposed between the first and second common voltage input units 11 and 12, a current density may be reduced when a current is applied, and heat generation may be suppressed.

The driving voltage supply line 20 may be disposed on the peripheral area PA, and may be electrically connected to the driving voltage lines PL, each extending across the display area DA in the first direction. According to an embodiment, the driving voltage supply line 20 may include first and second driving voltage input units (e.g., first and second driving voltage input lines or portions) 21 and 22 disposed on opposite sides with the third common voltage input unit 13 interposed therebetween.

The first and second scan driving circuits 31 and 32 may be disposed in the peripheral area PA, and may be electrically connected to the scan lines SL. According to an embodiment, some of the scan lines SL may be electrically connected to the first scan driving circuit 31, and the remaining scan lines SL may be connected to the second scan driving circuit 32. The first and second scan driving circuits 31 and 32 may generate a scan signal, and the generated scan signal may be transmitted to a transistor electrically connected to the light-emitting diode through the scan line SL.

The emission control driving circuit 33 may be disposed on a side of the first scan driving circuit 31, and may deliver an emission control signal to a transistor electrically connected to the light-emitting diode via the emission control line EL. Although the emission control driving circuit 33 is illustrated as being disposed on only one side of the display area DA in FIG. 1, a plurality of emission control driving circuits 33 may be disposed on opposite sides of the display area DA, similar to the first scan driving circuit 31 and the second scan driving circuit 32.

The data driving circuit 40 may be disposed on the subregion SR. The data driving circuit 40 may transmit a data signal to a transistor electrically connected to the light-emitting diode through the data line DL.

A first terminal portion TD1 may be located on one side of the substrate 100, for example, such as on one end of the subregion SR. A printed circuit board (PCB) 50 may be attached onto the first terminal portion TD1. The PCB 50 may include a second terminal portion TD2 electrically connected to the first terminal portion TD1, and a controller 60 may be disposed on the PCB 50. Control signals of the controller 60 may be provided to the first and second scan driving circuits 31 and 32, the emission control driving circuit 33, the data driving circuit 40, the driving voltage supply line 20, and the common voltage supply line 10, respectively, via the first and second terminal portions TD1 and TD2.

Figure 3:
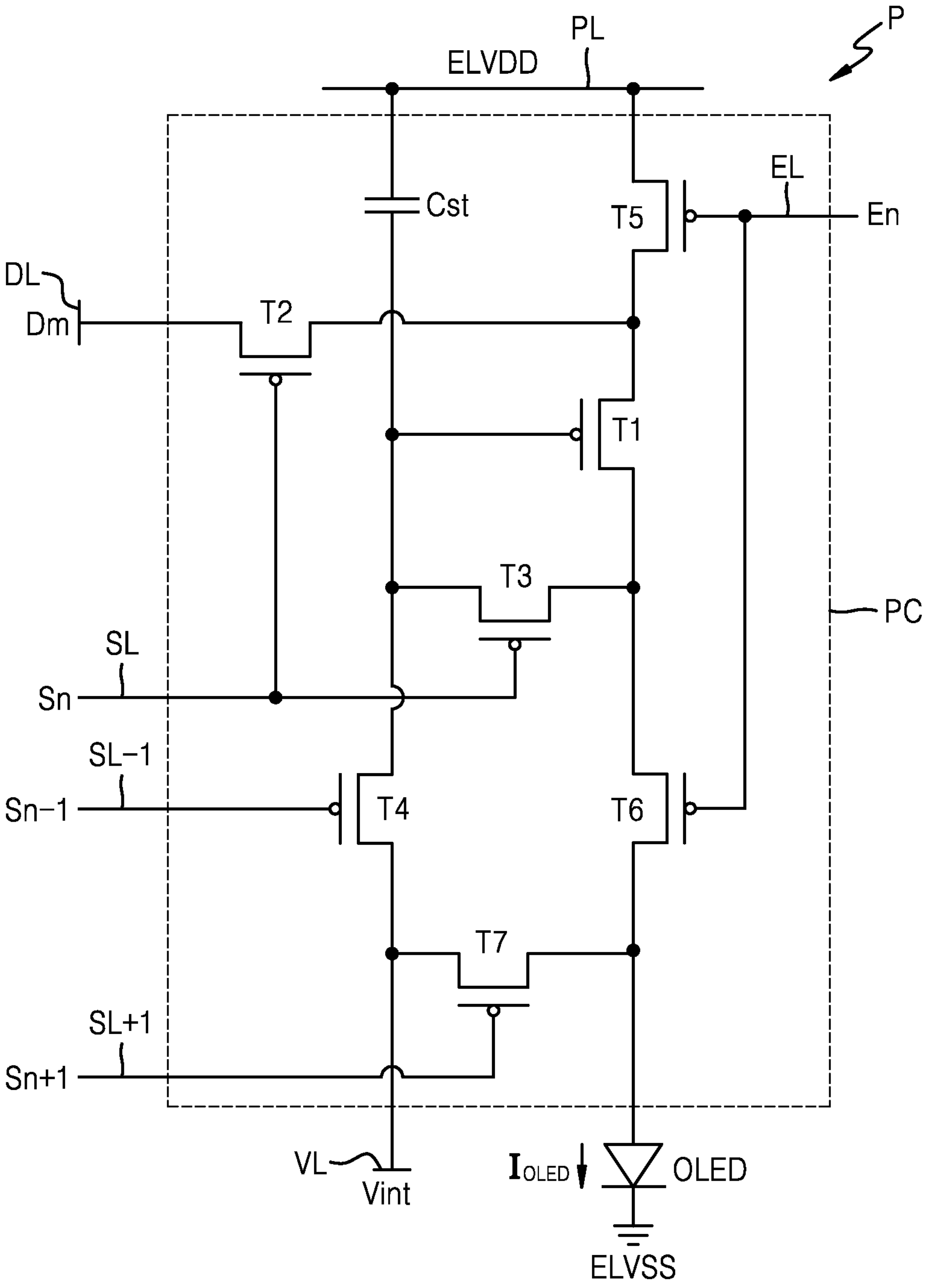
FIG. 3 is a schematic equivalent circuit diagram of a pixel circuit electrically connected to a light-emitting diode corresponding to a pixel of a display apparatus according to an embodiment.

FIG. 3 is a schematic equivalent circuit diagram of a pixel circuit electrically connected to a light-emitting diode corresponding to a pixel of a display apparatus according to an embodiment.

Referring to FIG. 3, one pixel P may include a pixel circuit PC, and an organic light-emitting diode OLED electrically connected to the pixel circuit PC.

For example, as shown in FIG. 3, the pixel circuit PC includes first, second, third, fourth, fifth, sixth, and seventh transistors T1, T2, T3, T4, T5, T6, and T7, and a storage capacitor Cst. The first through seventh transistors T1 through T7 and the storage capacitor Cst are connected to first, second, and third scan lines SL, SL−1, and SL+1 for transmitting first, second, and third scan signals Sn, Sn−1, and Sn+1, respectively, a data line DL for transmitting a data voltage Dm, a light-emission control line EL for transmitting a light-emission control signal En, a driving voltage line PL for transmitting a driving voltage ELVDD, an initializing voltage line VL for transmitting an initializing voltage Vint, and a common electrode to which a common voltage ELVSS is applied.

The first transistor T1 may be a driving transistor, in which the magnitude of a drain current is determined according to a gate-source voltage. The second through seventh transistors T2 through T7 may be switching transistors that are turned on/off according to a gate-source voltage, or substantially, a gate voltage. The first through seventh transistors T1 through T7 may be formed of thin-film transistors.

The first transistor T1 may be referred to as the driving transistor, the second transistor T2 may be referred to as a scan transistor, the third transistor T3 may be referred to as a compensating transistor, the fourth transistor T4 may be referred to as a gate initializing transistor, the fifth transistor T5 may be referred to as a first light-emission control transistor, the sixth transistor T6 may be referred to as a second light-emission control transistor, and the seventh transistor T72 may be referred to as an anode initializing transistor.

The storage capacitor Cst may be connected between the power line PL and a gate of the driving transistor T1. The storage capacitor Cst may have an upper electrode CE2 (e.g., see FIG. 4) connected to the power voltage line PL, and a lower electrode CE1 connected to (or formed with) the gate of the driving transistor T1.

The driving transistor T1 may control the magnitude of a driving current $I_{OLED}$ flowing from the driving voltage line PL to the organic light-emitting diode OLED according to the gate-source voltage. The driving transistor T1 may include the gate connected to the lower electrode CE1 of the storage capacitor Cst, a source connected to the driving voltage line PL through the first light-emission control transistor T5, and a drain connected to the organic light-emitting diode OLED through the second light-emission control transistor T6.

The driving transistor T1 may output the driving current $I_{OLED}$ to the organic light-emitting diode OLED according to the gate-source voltage. The magnitude of the driving current $I_{OLED}$ is determined based on a difference between the gate-source voltage and a threshold voltage of the driving transistor T1. The organic light-emitting diode OLED may receive the driving current $I_{OLED}$ from the driving transistor T1, and may emit light with a desired brightness based on the magnitude of the driving current $I_{OLED}$.

The scan transistor T2 transmits the data voltage Dm to the source of the driving transistor T1 in response to the first scan signal Sn. The scan transistor T2 may have a gate connected to the first scan line SL, a source connected to the data line DL, and a drain connected to the source of the driving transistor T1.

The compensating transistor T3 is connected (e.g., serially connected) between the drain and the gate of the driving transistor T1, and connects the drain and the gate of the driving transistor T1 to each other in response to the first scan signal Sn. In other words, when turned on, the compensating transistor T3 may diode-connect the driving transistor T1. The compensating transistor T3 may have a gate connected to the first scan line SL, a source connected to the drain of the driving transistor T1, and a drain connected to the gate of the driving transistor T1. Although the compensating transistor T3 is illustrated as including one transistor in FIG. 3, the compensating transistor T3 may include two transistors that are serially connected to each other between the gate and drain of the driving transistor T1.

The gate initializing transistor T4 applies an initializing voltage Vint to the gate of the driving transistor T1 in response to the second scan signal Sn−1. The gate initializing transistor T4 may have a gate connected to the second scan line SL−1, a source connected to the gate of the driving transistor T1, and a drain connected to the initializing voltage line VL. Although the gate initializing transistor T4 is illustrated as including one transistor in FIG. 3, the gate initializing transistor T4 may include two transistors that are serially connected to each other between the gate of the driving transistor T1 and the initializing voltage line VL.

The anode initializing transistor T7 applies the initializing voltage Vint to an anode of the organic light-emitting diode OLED in response to the third scan signal Sn+1. The anode initializing transistor T7 may include a gate connected to the third scan line SL+1, a source connected to the anode of the organic light-emitting diode OLED, and a drain connected to the initializing voltage line VL.

The first light-emission control transistor T5 may connect the driving voltage line PL to the source of the driving transistor T1 in response to the light-emission control signal En. The first light-emission control transistor T5 may have a gate connected to the light-emission control line EL, a source connected to the driving power line PL, and a drain connected to the source of the driving transistor T1.

The second light-emission control transistor T6 may connect the drain of the driving transistor T1 to the anode of the organic light-emitting diode OLED in response to the light-emission control signal En. The second light-emission control transistor T6 may have a gate connected to the light-emission control line EL, a source connected to the drain of the driving transistor T1, and a drain connected to the anode of the organic light-emitting diode OLED.

The second scan signal Sn−1 may be synchronized or substantially synchronized with the first scan signal Sn of a previous row. The third scan signal Sn+1 may be synchronized or substantially synchronized with the first scan signal Sn. According to another example, the third scan signal Sn+1 may be synchronized or substantially synchronized with the first scan signal Sn of a next row.

According to the present embodiment, each of the first through seventh transistors T1 through T7 may include a semiconductor layer including silicon. For example, the first through seventh transistors T1 through T7 may include semiconductor layers including low temperature polysilicon (LTPS). Because a polysilicon material has a high electron mobility (e.g., 100 cm/Vs or greater), energy consumption power may be low and reliability may be high.

According to another example, the semiconductor layers of the first through seventh transistors T1 through T7 may include an oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layers of the first through seventh transistors T1 through T7 may be an InSnZnO (ITZO) semiconductor layer, an InGaZnO (IGZO) semiconductor layer, and/or the like.

As another example, some of the semiconductor layers of the first through seventh transistors T1 through T7 may include LTPS, and others thereof may include an oxide semiconductor (e.g., IGZO or the like).

An operation process of one pixel PX of a display apparatus according to an embodiment will now be described in more detail. As shown in FIG. 3, the first through seventh transistors T1 through T7 are illustrated as p-type MOSFETs as a representative example, and will be described in more detail hereinafter under such an assumption.

First, in response to the light-emission control signal En of a high level (e.g., an inactive level), the first light-emission control transistor T5 and the second light-emission control transistor T6 are turned off, and the driving transistor T1 stops outputting the driving current $I_{OLED}$, and thus, the organic light-emitting diode OLED stops emitting light.

Thereafter, during a gate initialization period when a second scan signal Sn−1 of a low level (e.g., an active level) is received, the gate initializing transistor T4 is turned on, and the initializing voltage Vint is applied to the gate of the driving transistor T1, or in other words, to the lower electrode CE1 of the storage capacitor Cst. The storage capacitor Cst stores a difference (e.g., ELVDD−Vint) between the driving voltage ELVDD and the initializing voltage Vint.

Then, during a data write period when a first scan signal Sn of a low level (e.g., an active level) is received, the scan transistor T2 and the compensating transistor T3 are turned on, and the data voltage Dm is received by the source of the driving transistor T1. The driving transistor T1 is diode-connected by the compensating transistor T3, and is biased in a forward direction. The gate voltage of the driving transistor T1 increases from the initializing voltage Vint. When the gate voltage of the driving transistor T1 becomes equal to or substantially equal to a data compensating voltage (e.g., Dm−|Vth|) obtained by reducing a threshold voltage Vth of the driving transistor T1 from the data voltage Dm, the driving transistor T1 is turned off, and concurrently or at the same time, the gate voltage of the driving transistor T1 stops increasing. Accordingly, the storage capacitor Cst stores a difference (e.g., ELVDD-Dm+|Vth|) between the driving voltage ELVDD and the data compensating voltage (e.g., Dm−|Vth|).

During an anode initialization period when a third scan signal Sn+1 of a low level (e.g., an active level) is received, the anode initializing transistor T7 is turned on, and the initializing voltage Vint is applied to the anode of the organic light-emitting diode OLED. By allowing the organic light-emitting diode OLED to completely emit no light by applying the initializing voltage Vint to the anode of the organic light-emitting diode OLED, the pixel PX receives a data voltage Dm corresponding to a black grayscale (e.g., a black grayscale level or value) in a next frame, and minute light emission of the organic light-emitting diode OLED may be prevented or substantially prevented.

The first scan signal Sn and the third scan signal Sn+1 may be synchronized or substantially synchronized with each other. In this case, the data write period and the anode initialization period may be the same or substantially the same periods.

Thereafter, in response to the light-emission control signal En of a low level (e.g., an active level), the first light-emission control transistor T5 and the second light-emission control transistor T6 may be turned on, and the driving transistor T1 may output the driving current $I_{OLED}$ corresponding to the voltage (e.g., ELVDD-Dm) obtained by subtracting the threshold voltage |Vth| of the driving transistor T1 from a voltage stored in the storage capacitor Cst, or in other words, the source-gate voltage (e.g., ELVDD−Dm+|Vth|) of the driving transistor T1, and thus, the organic light-emitting diode OLED may emit light having a brightness corresponding to the magnitude of the driving current $I_{OLED}$.

Although a case where the pixel circuit PC including seven transistors and one storage capacitor is illustrated in FIG. 3, the present disclosure is not limited thereto. For example, the pixel circuit PC may include two or more transistors, and/or two or more storage capacitors. According to an embodiment, the pixel circuit PC may include two transistors and one storage capacitor.

Figure 4:
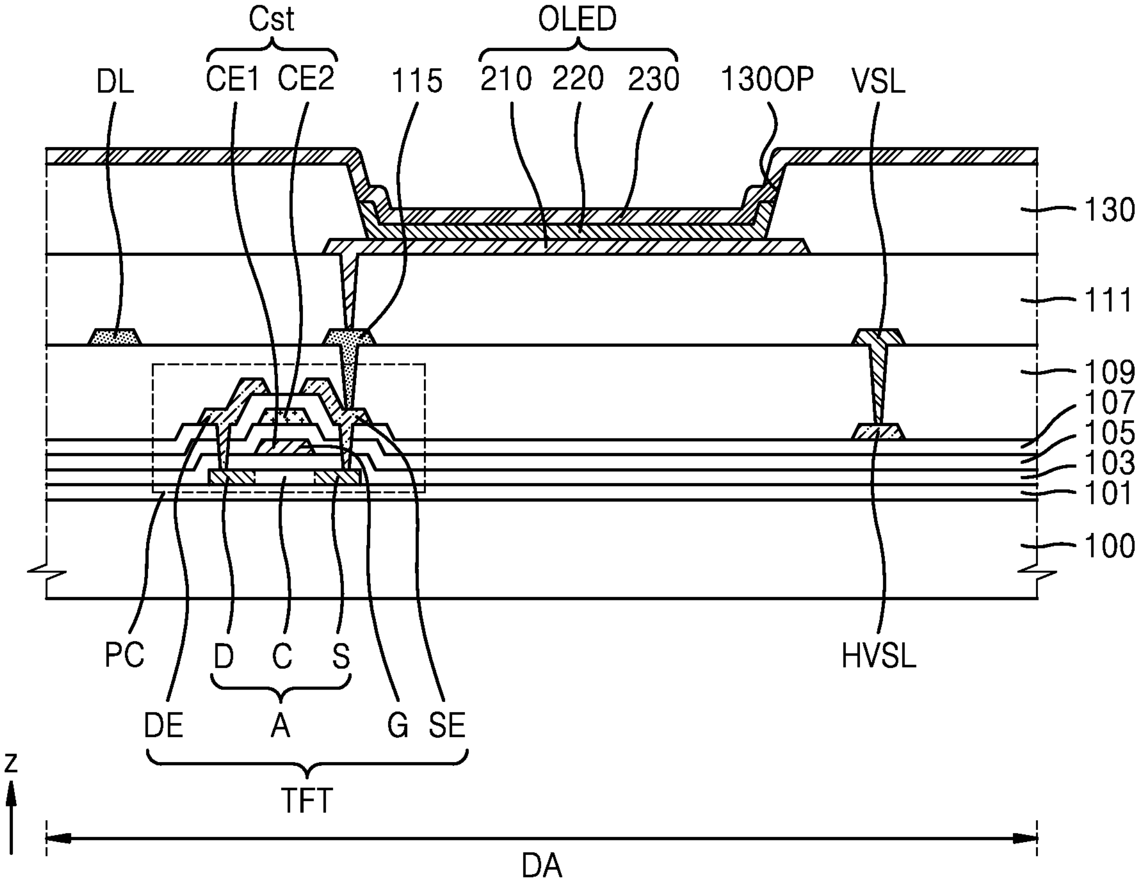
FIG. 4 is a schematic cross-sectional view of a light-emitting diode included in a display apparatus, and a pixel circuit electrically connected to the light-emitting diode, according to an embodiment.

FIG. 4 is a schematic cross-sectional view of a light-emitting diode included in a display apparatus, and a pixel circuit electrically connected to the light-emitting diode, according to an embodiment.

Referring to FIG. 4, the organic light-emitting diode OLED may be disposed in the display area DA, and may be electrically connected to the pixel circuit PC interposed between the substrate 100 and the organic light emitting diode OLED in a direction (e.g., the z direction) perpendicular to or substantially perpendicular to the substrate 100.

The substrate 100 may include a glass material or a polymer resin. According to an embodiment, the substrate 100 may have a structure in which a base layer including a polymer resin and a barrier layer including an inorganic insulating material, such as silicon oxide or silicon nitride, are alternately stacked. The polymer resin may include, for example, polyethersulfone, polyarylate, polyetherimide, polyethylene naphthalate, polyethylene terephthalate, polyphenylene sulfide, polyimide, polycarbonate, cellulose triacetate, or cellulose acetate propionate.

A buffer layer 101 to prevent or substantially prevent infiltration of impurities into the pixel circuit PC may be formed on the substrate 100 before the pixel circuit PC is formed. The buffer layer 101 may include an inorganic insulating material, such as silicon nitride, silicon oxynitride, or silicon oxide, and may be a single layer or multiple layers including one or more of the inorganic insulating materials.

The pixel circuit PC may include a thin-film transistor TFT and a storage capacitor Cst. The thin-film transistor TFT may be the driving transistor T1 described above with reference to FIG. 3.

The thin-film transistor TFT may include a semiconductor layer A, a gate electrode G, a source electrode SE, and a drain electrode DE.

The semiconductor layer A may be disposed on the buffer layer 101. The semiconductor layer A may include polysilicon. As another example, the semiconductor layer A may include amorphous silicon, an oxide semiconductor, or an organic semiconductor. According to an embodiment, the semiconductor layer A may include a channel region C, and a source region S and a drain region D disposed on opposite sides of the channel region C, respectively.

The gate electrode G may overlap with the channel region C of the semiconductor layer A. The gate electrode G may include a low resistance metal material.

A first inorganic insulating layer 103 may be disposed between the semiconductor layer A and the gate electrode G. The first inorganic insulating layer 103 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

A second inorganic insulating layer 105 may cover the gate electrode G. Similar to the first inorganic insulating layer 103, the second inorganic insulating layer 105 may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO).

An upper electrode CE2 of the storage capacitor Cst may be disposed on the second inorganic insulating layer 105. According to an embodiment, the upper electrode CE2 may overlap with the gate electrode G. In this case, the gate electrode GE and the upper electrode CE2 overlapping with each other with the second inorganic insulating layer 105 therebetween may constitute the storage capacitor Cst. In other words, the gate electrode GE may function as the lower electrode CE1 of the storage capacitor Cst. As such, the storage capacitor Cst and the thin-film transistor TFT may overlap with each other. According to another embodiment, the storage capacitor Cst and the thin-film transistor TFT may not overlap with each other.

A third inorganic insulating layer 107 may cover the upper electrode CE2. The third inorganic insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide (ZnO), or the like. The third inorganic insulating layer 107 may be a single layer or multi-layers including one or more of the aforementioned inorganic insulating materials.

The source electrode SE and the drain electrode DE may be disposed on the third inorganic insulating layer 107. At least one of the source electrode SE and/or the drain electrode DE may include a highly conductive material. At least one of the source electrode SE and/or the drain electrode DE may include a conductive material including, for example, molybdenum (Mo), aluminum (Al), copper (Cu), and/or titanium (Ti), and may have multi-layers or a single-layer structure including one or more of the aforementioned materials. According to an embodiment, at least one of the source electrode SE and/or the drain electrode DE may have a multi-layered structure of Ti/Al/Ti.

A first organic insulating layer 109 may be disposed on the third inorganic insulating layer 107. The first organic insulating layer 109 may be disposed on the source electrode SE and the drain electrode DE. The first organic insulating layer 109 may include an organic material. The first organic insulating layer 109 may include an organic insulating material, such as a commercial polymer (e.g., PMMA or PS), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a suitable blend thereof.

A data line DL and a vertical common voltage line VSL may be disposed on the first organic insulating layer 109. The data line DL and the vertical common voltage line VSL may include Al, Cu, and/or Ti, and may be multi-layers or a single layer including one or more of the aforementioned materials. For example, the data line DL and the vertical common voltage line VSL may have a three-layered structure of a Ti layer/Al layer/Ti layer.

The vertical common voltage line VSL may be electrically connected to a horizontal common voltage line HVSL disposed at (e.g., in or on) a different layer from that of the vertical common voltage line VSL. For example, the horizontal common voltage line HVSL may be disposed on the third inorganic insulating layer 107, and may be electrically connected to the vertical common voltage line VSL through a hole that penetrates through the first organic insulating layer 109. A voltage drop due to a resistance of the vertical common voltage line VSL itself may be prevented, minimized, or reduced through the electrical connection of the vertical common voltage line VSL and the horizontal common voltage line HVSL.

A second organic insulating layer 111 may be disposed on the data line DL and the vertical common voltage line VSL. The second organic insulating layer 111 may include an organic material. The second organic insulating layer 111 may include an organic insulating material, such as a commercial polymer (e.g., PMMA or PS), a polymer derivative having a phenol-based group, an acrylic polymer, an imide-based polymer, an acryl ether-based polymer, an amide-based polymer, a fluorine-based polymer, a p-xylene-based polymer, a vinyl alcohol-based polymer, or a suitable blend thereof.

The light-emitting diode, for example, such as the organic light-emitting diode OLED, may be disposed on the second organic insulating layer 111. For example, the organic light-emitting diode OLED may emit red light, green light, or blue light, or may emit red light, green light, blue light, or white light. The organic light-emitting diode OLED may include a pixel electrode 210, an emission layer 220, and an opposite electrode 230.

The pixel electrode 210 may be disposed on the second organic insulating layer 111. The pixel electrode 210 may be electrically connected to the thin-film transistor TFT. For example, the pixel electrode 210 may be connected to a lower conductive layer 115 through a contact hole of (e.g., penetrating) the second organic insulating layer 111, and the lower conductive layer 115 may be connected to the thin-film transistor TFT through a contact hole of (e.g., penetrating) the first organic insulating layer 109. The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 210 may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a suitable compound of these materials. According to another embodiment, the pixel electrode 210 may further include a film formed of ITO, IZO, ZnO, or $In_2O_3$ over/under the reflection layer.

A pixel defining layer 130 having an opening 130OP through which a center portion of the pixel electrode 210 is exposed, may be disposed on the pixel electrode 210. The pixel defining layer 130 may include an organic insulating material and/or an inorganic insulating material. The opening 130OP of the pixel defining layer 130 may define a light-emission area of light emitted by the organic light-emitting diode OLED.

The emission layer 220 may be disposed in the opening 130OP of the pixel defining layer 130. The emission layer 220 may include a low molecular or high molecular organic material that emits light of a desired color (e.g., a certain or predetermined color). In some embodiments, a first functional layer and a second functional layer may be disposed below and above the emission layer 220, respectively. The first functional layer may include a hole transport layer (HTL), or may include an HTL and a hole injection layer (HIL). The second functional layer is a component disposed above the emission layer 220, and may be optional. The second functional layer may include an electron transport layer (ETL) and/or an electron injection layer (EIL). The first functional layer and/or the second functional layer may be a common layer formed to entirely cover the substrate 100, similar to the opposite electrode 230 described in more detail below.

The opposite electrode 230 may be disposed on the emission layer 220. The opposite electrode 230 may entirely cover the substrate 100 in the display area DA. The opposite electrode 230 may include a conductive material having a low work function. For example, the opposite electrode 230 may include a (semi) transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a suitable alloy of these materials. As another example, the opposite electrode 230 may further include a suitable layer, such as ITO, IZO, ZnO, or $In_2O_3$, on the (semi) transparent layer including any one or more of the above-described materials.

In some embodiments, an encapsulation layer may be disposed on the organic light-emitting diode OLED. The encapsulation layer may include at least one inorganic encapsulation layer and at least one organic encapsulation layer that cover the organic light-emitting diode OLED. According to an embodiment, the at least one inorganic encapsulation layer and the at least one organic encapsulation layer may be alternately stacked. The at least one inorganic encapsulation layer may include one or more inorganic materials from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. Examples of the polymer-based material may include an acrylic resin, an epoxy-based resin, polyimide, and polyethylene. According to an embodiment, the at least one organic encapsulation layer may include acrylate.

Figure 5:
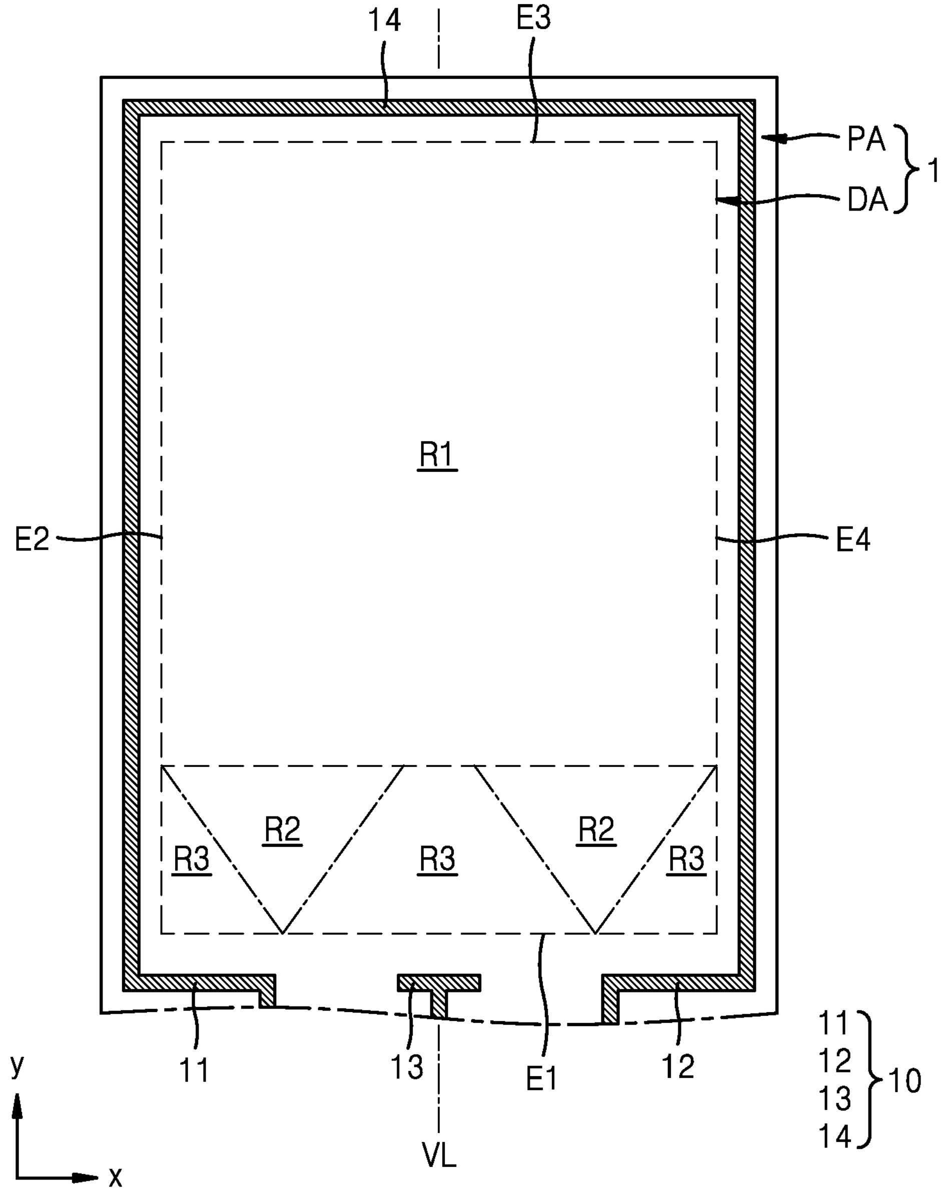
FIG. 5 is a plan view of areas of a display panel of a display apparatus according to an embodiment.
Figure 6:
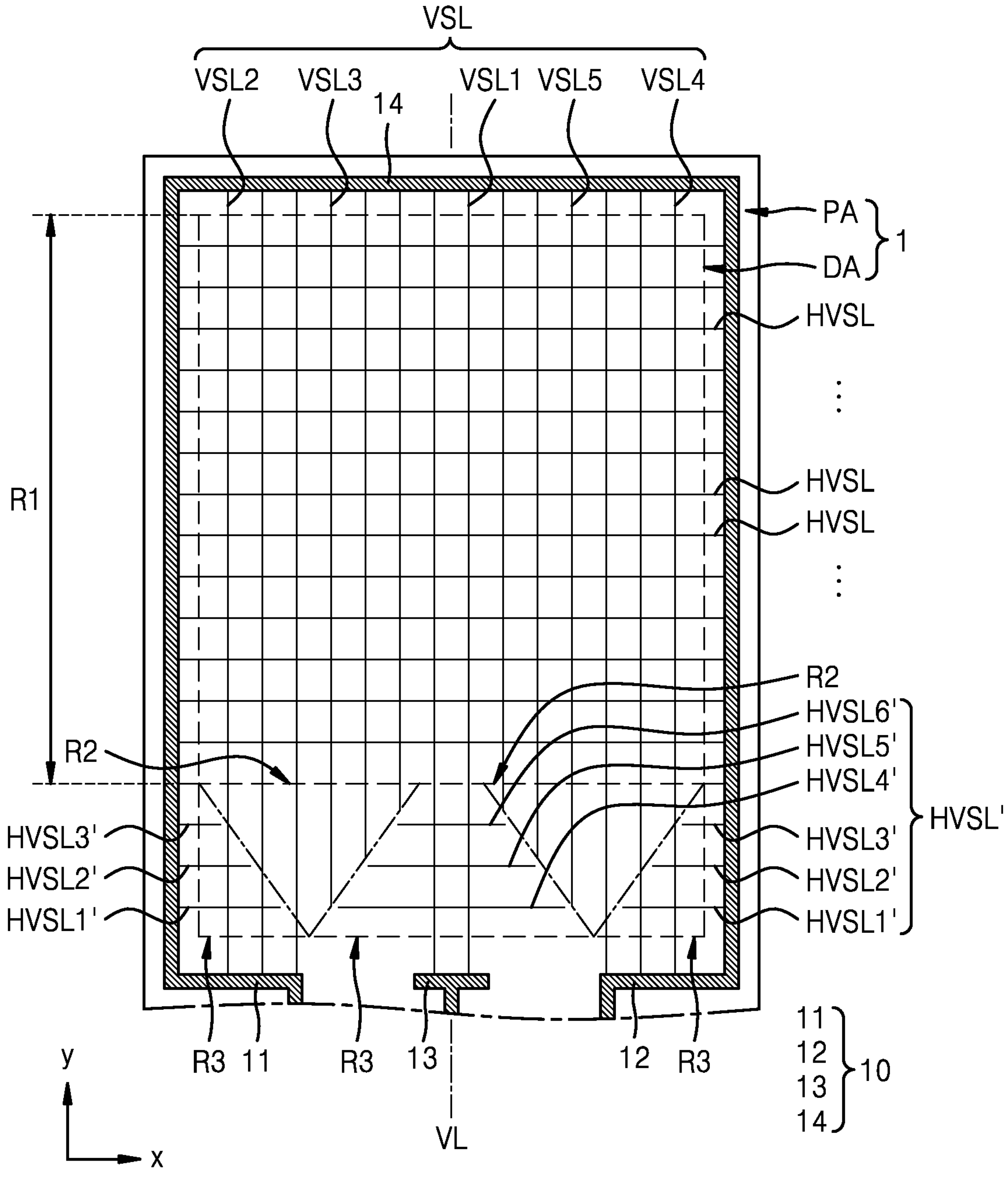
FIG. 6 is a plan view of common voltage lines of a display apparatus according to an embodiment.
Figure 7:
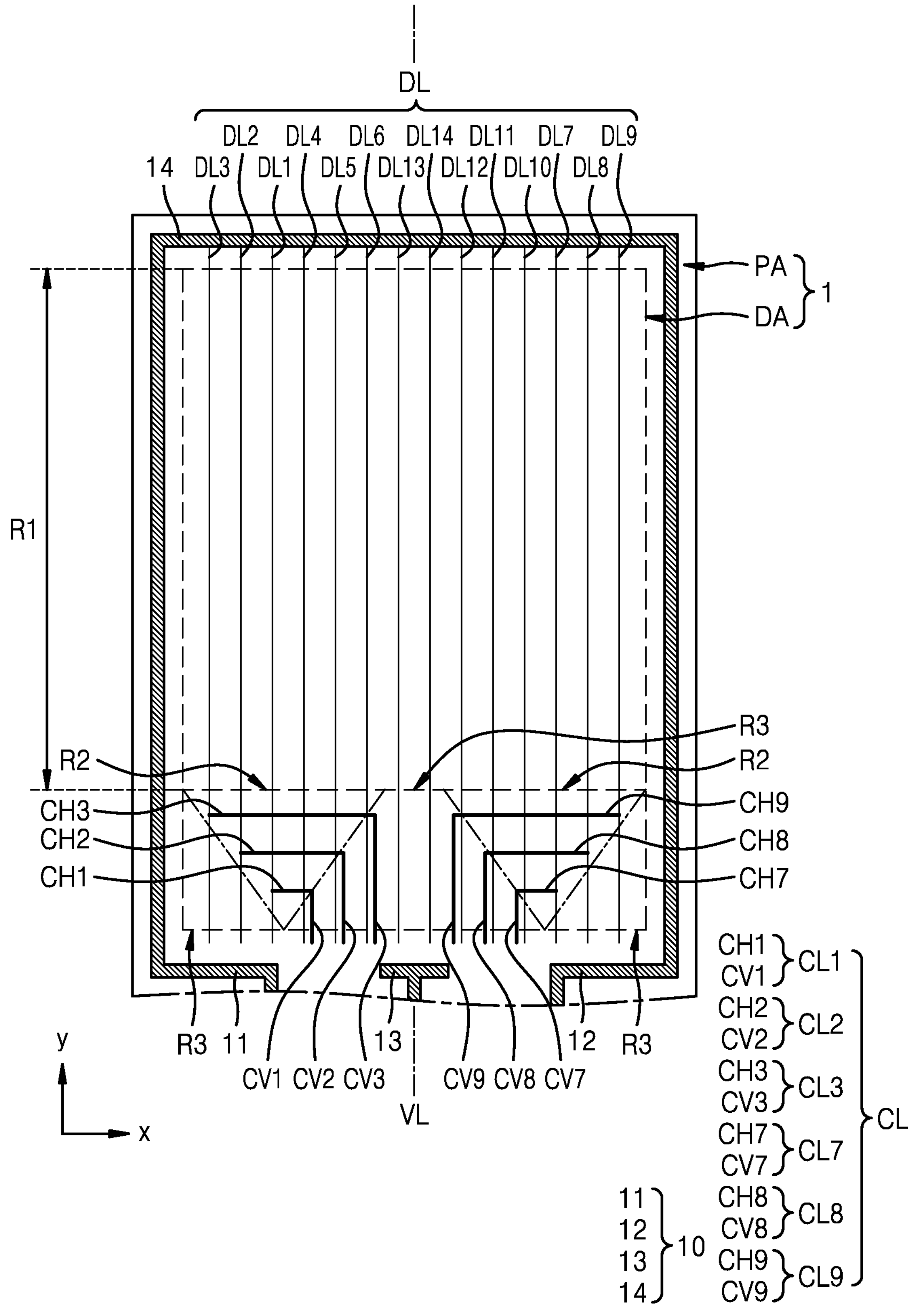
FIG. 7 is a plan view of data lines and connection lines of a display apparatus according to an embodiment.

FIG. 5 is a plan view of areas of a display panel of a display apparatus according to an embodiment. Referring to FIG. 5, the common voltage supply line 10 may be disposed in the peripheral area PA as described above with reference to FIG. 1. The driving voltage supply line 20 (e.g., see FIG. 1), the first and second scan driving circuits 31 and 32, and the like may be provided in the peripheral area PA, but for convenience of illustration, they are not shown in FIG. 5. The first common voltage input unit 11, the second common voltage input unit 12, and the third common voltage input unit 13 of the common voltage supply line 10 may be disposed at (e.g., in or on) the same side as each other of the display area DA. In this regard, FIGS. 5 through 7 show that the first common voltage input unit 11, the second common voltage input unit 12, and the third common voltage input unit 13 are disposed adjacent to the first edge E1 of the display area DA. A detailed arrangement thereof is the same as described above with reference to FIG. 1.

Figure 8:
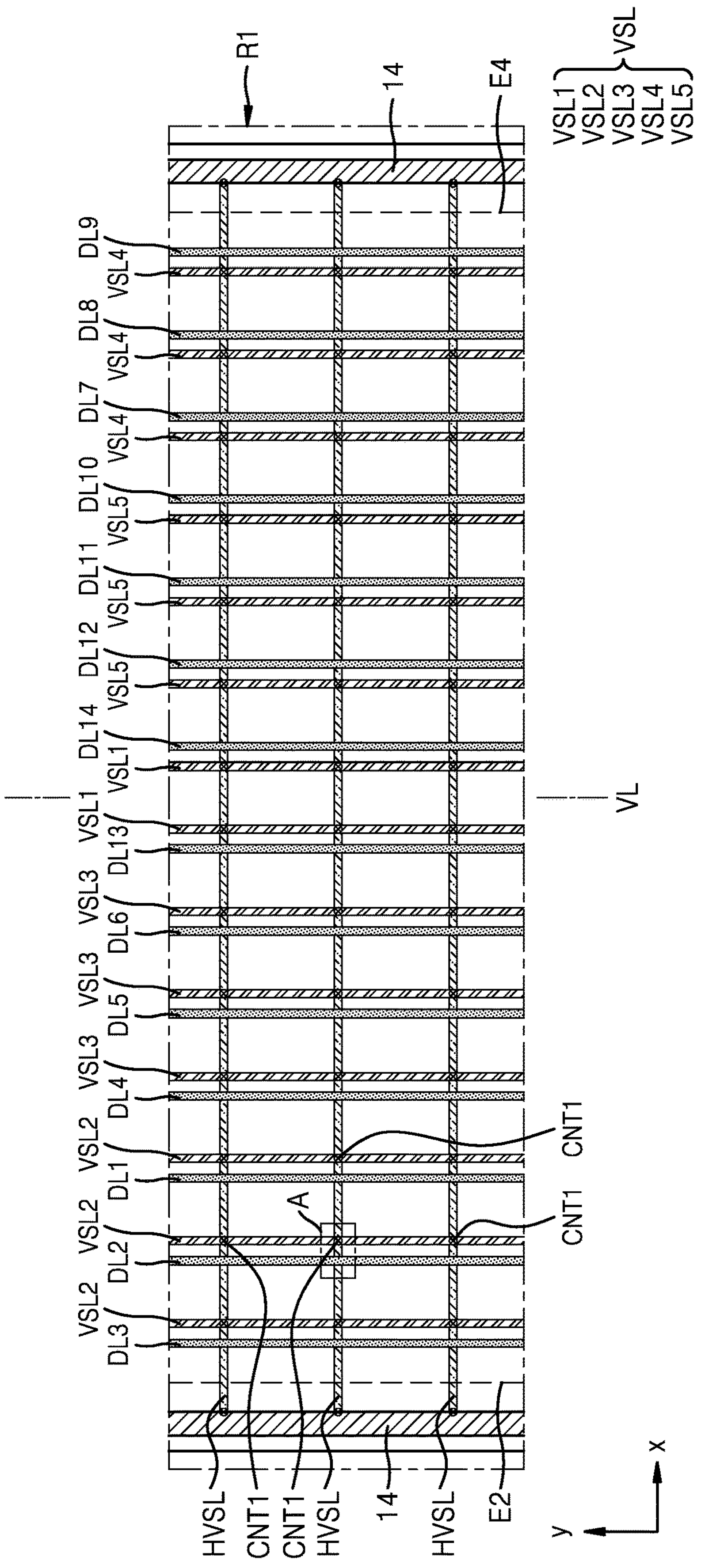
FIG. 8 is an enlarged plan view of a portion of a first region of FIG. 5, according to an embodiment.
Figure 9:
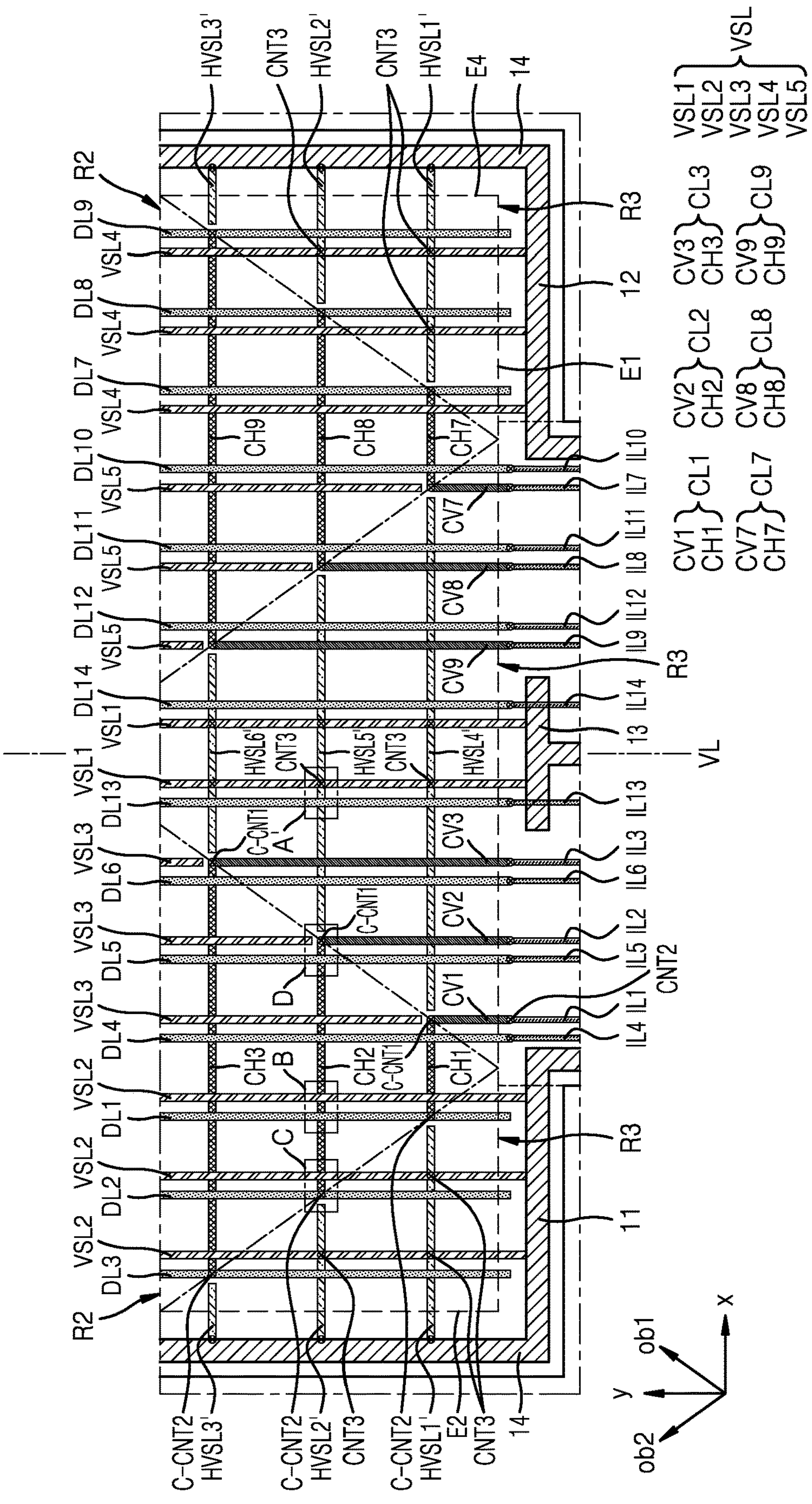
FIG. 9 is an enlarged plan view of portions of a second region and a third region of FIG. 5, according to an embodiment.

FIG. 6 is a plan view of common voltage lines of a display apparatus according to an embodiment. FIG. 7 is a plan view of data lines and connection lines of a display apparatus according to an embodiment. FIG. 8 is an enlarged plan view of a portion of a first region of FIG. 5, according to an embodiment. FIG. 9 is an enlarged plan view of portions of a second region and a third region of FIG. 5, according to an embodiment.

Referring to FIGS. 5 through 9, the display area DA may include a first region R1, a second region R2, and a third region R3. As shown in FIG. 6, the first region R1 may be a region where a vertical common voltage line VSL and a horizontal common voltage line HVSL cross or intersect each other. The second region R2 may be a region where a horizontal connection portion of a connection line CL (e.g., see FIG. 7) crosses or intersects at least a portion of the vertical common voltage line VSL (e.g., see FIG. 6). As shown in FIG. 6, the third region R3 may be a region where the vertical common voltage line VSL and an auxiliary horizontal common voltage line HVSL' cross or intersect each other.

In more detail, referring to FIG. 6, the display panel 1 may include a plurality of vertical common voltage lines VSL and a plurality of horizontal common voltage lines HVSL. The display panel 1 may further include a plurality of auxiliary horizontal common voltage lines HVSL'.

The plurality of vertical common voltage lines VSL may each extend in the first direction (e.g., the y direction), and may be arranged along the second direction (e.g., the x direction) crossing or intersecting the first direction. The vertical common voltage lines VSL may each extend in the first direction in the display area DA, and thus, may be electrically connected to the common voltage supply line 10. The vertical common voltage lines VSL may include a first vertical common voltage line VSL1, a second vertical common voltage line VSL2, a third vertical common voltage line VSL3, a fourth vertical common voltage line VSL4, and a fifth vertical common voltage line VSL5.

As shown in FIGS. 6 and 9, the first vertical common voltage line VSL1 may be a common voltage line that is electrically connected to the third common voltage input unit 13, and extending from the third common voltage input unit 13 to cross the display area DA, from among the vertical common voltage lines VSL. The second vertical common voltage line VSL2 may be a common voltage line that is electrically connected to the first common voltage input unit 11, and extending from the first common voltage input unit 11 to cross the display area DA, from among the vertical common voltage lines VSL. The third vertical common voltage line VSL3 may be a common voltage line disposed between a group of first vertical common voltage lines VSL1 and a group of second vertical common voltage lines VSL2. The fourth vertical common voltage line VSL4 may be a common voltage line that is electrically connected to the second common voltage input unit 12, and extends from the second common voltage input unit 12 to cross the display area DA, from among the vertical common voltage lines VSL. The fifth vertical common voltage line VSL5 may be a common voltage line disposed between a group of first vertical common voltage lines VSL1 and a group of fourth vertical common voltage lines VSL4.

A length of the third vertical common voltage line VSL3 in the first direction may be less than a length of the first vertical common voltage line VSL1 in the first direction. The length of the third vertical common voltage line VSL3 in the first direction may be less than a length of the second vertical common voltage line VSL2 in the first direction. A length of the fifth vertical common voltage line VSL5 in the first direction may be less than a length of the fourth vertical common voltage line VSL4 in the first direction. The length of the fifth vertical common voltage line VSL5 in the first direction may be less than the length of the first vertical common voltage line VSL1 in the first direction.

As shown in FIGS. 6 and 8, the plurality of horizontal common voltage lines HVSL may each extend in the second direction (e.g., the x direction), and may be arranged along the first direction (e.g., the y direction) crossing or intersecting the second direction. The plurality of horizontal common voltage lines HVSL may each extend in the second direction in the display area DA, and thus, may be electrically connected to the vertical common voltage lines VSL. The plurality of horizontal common voltage lines HVSL may be electrically connected to the vertical common voltage lines VSL to prevent or substantially prevent voltage drops of the vertical common voltage lines VSL.

The horizontal common voltage lines HVSL may each extend to traverse the display area DA in the second direction. The horizontal common voltage lines HVSL may be electrically connected to the body unit 14 of the common voltage supply line 10. The horizontal common voltage lines HVSL may be disposed farther from the first edge E1 (e.g., see FIG. 5) of the display area DA than (e.g., compared to) the auxiliary horizontal common voltage lines HVSL'.

The horizontal common voltage lines HVSL may be disposed at (e.g., in or on) a different layer from that of the vertical common voltage lines VSL extending in the first direction. For example, at least one insulating layer (e.g., the first organic insulating layer 109 described above with reference to FIG. 4) may be interposed between the horizontal common voltage lines HVSL and the vertical common voltage lines VSL. As shown in FIG. 8, the vertical common voltage lines VSL may be electrically connected to the horizontal common voltage lines HVSL through a first contact hole CNT1 penetrating through the above-described at least one insulating layer (e.g., the first organic insulating layer 109). The first contact hole CNT1 may be located in the display area DA. According to an embodiment, the vertical common voltage lines VSL and the horizontal common voltage lines HVSL are connected to each other by the first contact hole CNT1 in all regions where the vertical common voltage lines VSL cross or intersect the horizontal common voltage lines HVSL, respectively. However, the present disclosure is not limited thereto. According to another embodiment, the vertical common voltage lines VSL and the horizontal common voltage lines HVSL may not be connected to each other by the first contact hole CNT1 in some of the regions where the vertical common voltage lines VSL cross or intersect the horizontal common voltage lines HVSL.

As shown in FIGS. 6 and 9, the plurality of auxiliary horizontal common voltage lines HVSL' may each extend in the second direction (e.g., the x direction), and may be arranged along the first direction (e.g., the y direction). The auxiliary horizontal common voltage lines HVSL' may be disposed in a direction (e.g., the x direction) crossing or intersecting the vertical common voltage lines VSL. The auxiliary horizontal common voltage lines HVSL' may be spaced apart from the horizontal common voltage lines HVSL, and may each extend in the same direction as that of the horizontal common voltage lines HVSL (e.g., in the x direction). The auxiliary horizontal common voltage lines HVSL' may be electrically connected to the vertical common voltage lines VSL. The auxiliary horizontal common voltage lines HVSL' may have different lengths from that of the horizontal common voltage lines HVSL. For example, a length of each of the auxiliary horizontal common voltage lines HVSL' in the second direction may be less than a length of each of the horizontal common voltage lines HVSL in the second direction. The auxiliary horizontal common voltage lines HVSL' may be disposed adjacent to the first edge E1 of the display area DA.

The auxiliary horizontal common voltage lines HVSL' may include first, second, and third auxiliary horizontal common voltage lines HVSL1', HVSL2', and HVSL3' connected to the body unit 14 of the common voltage supply line 10, and fourth, fifth, and sixth auxiliary horizontal common voltage lines HVSL4', HVSL5', and HVSL6' having opposite ends, respectively, that are spaced apart from the body unit 14 of the common voltage supply line 10. The first, second, and third auxiliary horizontal common voltage lines HVSL1', HVSL2', and HVSL3' may each extend from the body unit 14 of the common voltage supply line 10 toward the display area DA with one end of each of the first, second, and third auxiliary horizontal common voltage lines HVSL1', HVSL2', and HVSL3' being electrically connected to the body unit 14. The fourth, fifth, and sixth auxiliary horizontal common voltage lines HVSL4', HVSL5', and HVSL6' may be disposed between a pair of groups of first, second, and third auxiliary horizontal common voltage lines HVSL1', HVSL2', and HVSL3' disposed on opposite sides. For example, the fourth, fifth, and sixth auxiliary horizontal common voltage lines HVSL4', HVSL5', and HVSL6' may be disposed between first, second, and third auxiliary horizontal common voltage lines HVSL1', HVSL2', and HVSL3' adjacent to the second edge E2, and first, second, and third auxiliary horizontal common voltage lines HVSL1', HVSL2', and HVSL3' adjacent to the fourth edge E4.

The auxiliary horizontal common voltage lines HVSL' may be disposed at (e.g., in or on) the same layer as that of the horizontal common voltage lines HVSL. The auxiliary horizontal common voltage lines HVSL' may be disposed at (e.g., in or on) a different layer from that of the vertical common voltage lines VSL extending in the first direction. For example, at least one insulating layer (e.g., the first organic insulating layer 109 described above with reference to FIG. 4) may be interposed between the auxiliary horizontal common voltage lines HVSL' and the vertical common voltage lines VSL. As shown in FIG. 9, the vertical common voltage lines VSL may be electrically connected to the auxiliary horizontal common voltage lines HVSL' through a third contact hole CNT3 penetrating through the above-described at least one insulating layer (e.g., the first organic insulating layer 109). The third contact hole CNT3 may be located in the display area DA.

As shown in FIGS. 7 and 9, the data lines DL may each extend to cross the display area DA in the first direction. First, second, third, fourth, fifth, and sixth data lines DL1, DL2, DL3, DL4, DL5, and DL6 may be disposed on the left side of a virtual center line VL traversing the third common voltage input unit 13. Seventh, eighteenth, ninth, tenth, eleventh, and twelfth data lines DL7, DL8, DL9, DL10, DL11, and DL12 may be disposed on the right side of the virtual center line VL. For example, the data lines DL may include the first through sixth data lines DL1 through DL6 disposed on the left side of the virtual center line VL, the seventh through twelfth data lines DL7 through DL12 disposed on the right side of the virtual center line VL, and thirteenth and fourteenth data lines DL13 and DL14 disposed between them.

The data lines DL may be connected to data input lines IL1 through IL14 disposed in the peripheral area PA. The data input lines IL1 through IL14 may be disposed in a space between the first common voltage input unit 11 and the second common voltage input unit 12 in a portion of the peripheral area PA.

The first through third data lines DL1 through DL3 may be electrically connected to the first through third data input lines IL1 through IL3 through connection lines CL1 through CL3, respectively. The fourth through sixth data lines DL4 through DL6 may be electrically connected to the fourth through sixth data input lines IL4 through IL6 without (e.g., not via) connection lines. The seventh through ninth data lines DL7 through DL9 may be electrically connected to the seventh through ninth data input lines IL7 through IL9 through connection lines CL7 through CL9, respectively. The tenth through twelfth data lines DL10 through DL12 may be electrically connected to the tenth through twelfth data input lines IL10 through IL12 without (e.g., not via) connection lines. The thirteenth and fourteenth data lines DL13 and 14 may be electrically connected to the thirteenth and fourteenth data input lines IL13 and IL14, respectively.

The first data line DL1 may be electrically connected to the first data input line IL1 through the first connection line CL1 including a first vertical connection portion CV1 and a first horizontal connection portion CH1. The first connection line CL1 may be located in the display area DA. For example, the first vertical connection portion CV1 of the first connection line CL1 may extend in the first direction in the display area DA, and the first horizontal connection portion CH1 may extend in the second direction in the display area DA.

The first vertical connection portion CV1 of the first connection line CL1 may be disposed at (e.g., in or on) the same layer (e.g., on the first organic insulating layer 109 described above with reference to FIG. 4) as that of the first data line DL1. The first vertical connection portion CV1 of the first connection line CL1 may be disposed at (e.g., in or on) the same layer as that of the vertical common voltage line VSL. The first horizontal connection portion CH1 of the first connection line CL1 may be disposed at (e.g., in or on) the same layer (e.g., on the third inorganic insulating layer 107 described above with reference to FIG. 4) as that of the horizontal common voltage line HVSL.

The first vertical connection portion CV1 may be disposed at (e.g., in or on) a different layer from that of the first data input line IL1, and may be connected to the first data input line IL1 through a second contact hole CNT2 penetrating through at least one insulating layer interposed between the first vertical connection portion CV1 and the first data input line IL1.

The first vertical connection portion CV1 and the first horizontal connection portion CH1 disposed at (e.g., in or on) different layers from each other may be connected to the first horizontal connection portion CH1 through a first connection contact hole C-CNT1 penetrating through at least one insulating layer interposed between the first vertical connection portion CV1 and the first horizontal connection portion CH1 (e.g., the first organic insulating layer 109 described above with reference to FIG. 4).

The first horizontal connection portion CH1 may be disposed at (e.g., in or on) a different layer from that of the first data line DL1. The first horizontal connection portion CH1 may be connected to the first data line DL1 through a second connection contact hole C-CNT2 penetrating through at least one insulating layer interposed between the first horizontal connection portion CH1 and the first data line DL1 (e.g., the first organic insulating layer 109 described above with reference to FIG. 4).

The first horizontal connection portion CH1 may be disposed between the first auxiliary horizontal common voltage line HVSL1' and the fourth auxiliary horizontal common voltage line HVSL4' spaced apart from each other. As the length of each of the first auxiliary horizontal common voltage line HVSL1' and the fourth auxiliary horizontal common voltage line HVSL4' increases, it may be easier to prevent or substantially prevent a voltage drop due to a self-resistance. Therefore, one end of the fourth auxiliary horizontal common voltage line HVSL4' may be located adjacent to a connection area between the first vertical connection portion CV1 and the first horizontal connection portion CH1, for example, such as the first connection contact hole C-CNT1. Similarly, one end of the first auxiliary horizontal common voltage line HVSL1' may be located adjacent to a connection area between the first data line DL1 and the first horizontal connection portion CH1, for example, such as the second connection contact hole C-CNT2.

The second data line DL2 may be electrically connected to the second data input line IL2 through the second connection line CL2 including a second vertical connection portion CV2 and a second horizontal connection portion CH2. The second vertical connection portion CV2 and the second horizontal connection portion CH2 may be disposed at (e.g., in or on) the same layers as those of the first vertical connection portion CV1 and the first horizontal connection portion CH1, respectively, and may have the same or substantially the same connection structure as that of the first vertical connection portion CV1 and the first horizontal connection portion CH1.

One end of the second vertical connection portion CV2 of the second connection line CL2 may be connected to the second data input line IL2, and the other end thereof may be connected to one end of the second horizontal connection portion CH2 through the first connection contact hole C-CNT1. The other end of the second horizontal connection portion CH2 may be connected to the second data line DL2 through the second connection contact hole C-CNT2.

The second horizontal connection portion CH2 may be disposed between the second auxiliary horizontal common voltage line HVSL2' and the fifth auxiliary horizontal common voltage line HVSL5' spaced apart from each other. One end of the fifth auxiliary horizontal common voltage line HVSL5' may be located adjacent to a connection area between the second vertical connection portion CV2 and the second horizontal connection portion CH2, for example, such as the first connection contact hole C-CNT1. Similarly, one end of the second auxiliary horizontal common voltage line HVSL2' may be located adjacent to a connection area between the second data line DL2 and the second horizontal connection portion CH2, for example, such as the second connection contact hole C-CNT2.

The third data line DL3 may be electrically connected to the third data input line IL3 through the third connection line CL3 including a third vertical connection portion CV3 and a third horizontal connection portion CH3. The third vertical connection portion CV3 and the third horizontal connection portion CH3 may be disposed at (e.g., in or on) the same layers as those of the first vertical connection portion CV1 and the first horizontal connection portion CH1, respectively, and may have the same or substantially the same connection structure as that of the first vertical connection portion CV1 and the first horizontal connection portion CH1.

One end of the third vertical connection portion CV3 of the third connection line CL3 may be connected to the third data input line IL3, and the other end thereof may be connected to one end of the third horizontal connection portion CH3 through the first connection contact hole C-CNT1. The other end of the third horizontal connection portion CH3 may be connected to the third data line DL3 through the second connection contact hole C-CNT2.

The third horizontal connection portion CH3 may be disposed between the third auxiliary horizontal common voltage line HVSL3' and the sixth auxiliary horizontal common voltage line HVSL6' spaced apart from each other. One end of the sixth auxiliary horizontal common voltage line HVSL6' may be located adjacent to a connection area between the third vertical connection portion CV3 and the third horizontal connection portion CH3, for example, such as the first connection contact hole C-CNT1. Similarly, one end of the third auxiliary horizontal common voltage line HVSL3' may be located adjacent to a connection area between the third data line DL3 and the third horizontal connection portion CH3, for example, such as the second connection contact hole C-CNT2.

The first through third horizontal connection portions CH1 through CH3 of the first through third connection lines CL1 through CL3 may have different lengths from each other, and the first through third vertical connection portions CV1 through CV3 of the first through third connection lines CL1 through CL3 may have different lengths from each other. For example, the lengths may increase in the order of the first horizontal connection portion CH1, the second horizontal connection portion CH2, and the third horizontal connection portion CH3, and the lengths may increase in the order of the first vertical connection portion CV1, the second vertical connection portion CV2, and the third vertical connection portion CV3.

The first through third auxiliary horizontal common voltage lines HVSL1' through HVSL3' disposed at (e.g., in or on) the same layer as that of the first through third horizontal connection portions CH1 through CH3 may have different lengths from each other. The fourth through sixth auxiliary horizontal common voltage lines HVSL4' through HVSL6' disposed at (e.g., in or on) the same layer as that of the first through third horizontal connection portions CH1 through CH3 may have different lengths from each other. The lengths may decrease in the order of the first auxiliary horizontal common voltage line HVSL1', the second auxiliary horizontal common voltage line HVSL2', and the third auxiliary horizontal common voltage line HVSL3'. The lengths may decrease in the order of the fourth auxiliary horizontal common voltage line HVSL4', the fifth auxiliary horizontal common voltage line HVSL5', and the sixth auxiliary horizontal common voltage line HVSL6'.

The first connection contact holes C-CNT1 and the second connection contact holes C-CNT2 are positioned in the display area DA, and as shown in FIG. 9, may be arranged along an oblique direction. The first connection contact holes C-CNT1 may be arranged along a first oblique direction ob1 forming an acute angle with the x and y directions, and the second connection contact holes C-CNT2 may be arranged along a second oblique direction ob2 crossing or intersecting the first oblique direction ob1 to form a V shape with the first oblique direction ob1.

Lengths of common voltage lines extending adjacent to the first connection contact holes C-CNT1, for example, such as the third vertical common voltage lines VSL3, may be less than the length of the first vertical common voltage line VSL1 or the second vertical common voltage line VSL2. Because the third vertical common voltage line VSL3 is disposed at (e.g., in or on) the same layer as that of the first through third vertical connection portions CV1 through CV3, one end of the third vertical common voltage line VSL3 may be positioned adjacent to the first connection contact hole C-CNT1 while being spaced apart from a vertical connection portion (e.g., the second vertical connection portion CV2). One end of the third vertical common voltage line VSL3, one end of the fifth auxiliary horizontal common voltage line HVSL5', and the first connection contact hole C-CNT1 may be disposed adjacent to one another. However, because the second vertical common voltage line VSL2 is disposed at (e.g., in or on) a different layer from that of the first through third horizontal connection portions CH1 through CH3, the second vertical common voltage line VSL2 may overlap with a horizontal connection portion (e.g., the second horizontal connection portion CH2), and may extend toward the peripheral area PA.

The structure of the first through sixth data lines DL1 through DL6 and the second and third vertical common voltage lines VSL2 and VLS3, the first through third auxiliary horizontal common voltage lines HVSL1' through VHSL3', and the fourth through sixth auxiliary horizontal common voltage lines HVSL4' through VHSL6' disposed around the first through sixth data lines DL1 through DL6 described above may be equally applicable to the wirings or lines shown on the right side of the virtual center line VL. In other words, a structure of the seventh through ninth vertical connection portions CV7 through CV9 and the seventh through ninth horizontal connection portions CH7 through CH9 connected to the seventh through ninth data lines DL7 through DL9 and their surroundings may be the same or substantially the same as a structure of the first through third vertical connection portions CV1 through CV3 and the first through third horizontal connection portions CH1 through CH3 connected to the first through third data lines DL1 through DL3 and their surroundings. According to some embodiments, as shown in FIG. 9, the first through third vertical connection portions CV1 through CV3 may be symmetrical or substantially symmetrical with the seventh through ninth vertical connection portions CV7 through CV9 relative to the virtual center line VL extending over the third common voltage input unit 13 in the first direction. Similarly, the first through third horizontal connection portions CH1 through CH3 may be symmetrical or substantially symmetrical with the seventh through ninth horizontal connection portions CH7 through CH9 relative to the virtual center line VL.

Figure 10A:
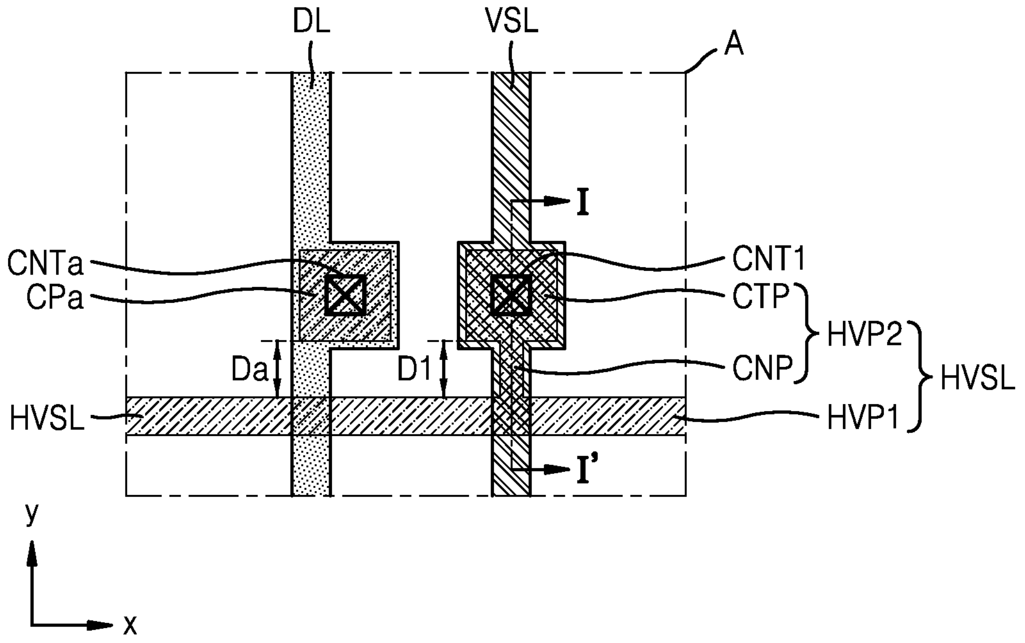
FIG. 10A is an enlarged view of the region A of FIG. 8.
Figure 10B:
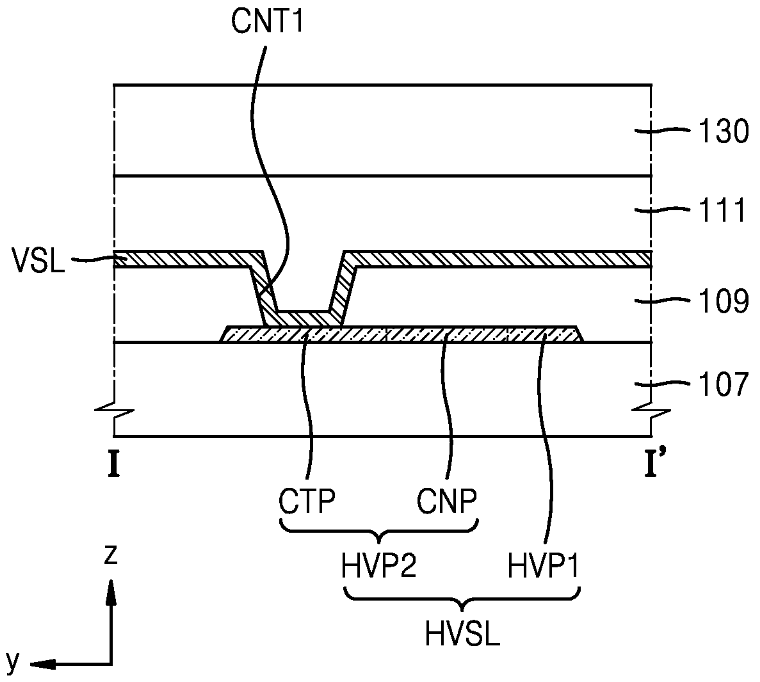
FIG. 10B is a cross-sectional view of a portion of a display panel taken along the line I-I' of FIG. 10A.

FIG. 10A is an enlarged view of the region A of FIG. 8. FIG. 10B is a cross-sectional view of a portion of a display panel taken along the line I-I' of FIG. 10A.

Referring to FIGS. 8, 10A, and 10B, the shapes and the arrangement relationships of the vertical common voltage line VSL and the horizontal common voltage line HVSL in the first region R1 of the display area DA are illustrated in more detail. FIG. 10A shows a crossing area (e.g., an intersection) between one vertical common voltage line VSL and one horizontal common voltage line HVSL of FIG. 8, but the structure, the connection relationships, and the arrangement relationships described in more detail hereinafter with reference to FIG. 10A may also be equally or substantially equally applied to other crossing areas (e.g., crossing areas (e.g., intersections)) between various common voltage lines VSL and other horizontal common voltage lines HVSL disposed on the first region R1 of the display area DA.

The horizontal common voltage line HVSL may include a first portion HVP1 extending in the second direction (e.g., the x direction), and a second portion HVP2 protruding from the first portion HVP1 in the first direction (e.g., the y direction). Both ends of the first portion HVP1 of the horizontal common voltage line HVSL may be connected to the body unit 14 (e.g., see FIG. 8) of the common voltage supply line 10 (e.g., see FIG. 6). The second portion HVP2 of the horizontal common voltage line HVSL may overlap with the vertical common voltage line VSL. The second portion HVP2 of the horizontal common voltage line HVSL may be a protrusion from the first portion HVP1.

The horizontal common voltage line HVSL may be connected to the vertical common voltage line VSL through the first contact hole CNT1. The second portion HVP2 of the horizontal common voltage line HVSL may be connected to the vertical common voltage line VSL through the first contact hole CNT1. The horizontal common voltage line HVSL and the vertical common voltage line VSL disposed at (e.g., in or on) different layers from each other may be connected to each other through the first contact hole CNT1 penetrating through at least one insulating layer (e.g., the first organic insulating layer 109). The second portion HVP2 of the horizontal common voltage line HVSL may include a contact portion CTP connected to the vertical common voltage line VSL through the first contact hole CNT1, and a connection portion CNP connecting the contact portion CTP to the first portion HVP1 of the horizontal common voltage line HVSL.

A width of the connection portion CNP of the horizontal common voltage line HVSL in the second direction (e.g., the x direction) may be less than a width of the contact portion CTP of the horizontal common voltage line HVSL in the second direction. In FIG. 10A, the shape of the contact portion CTP of the horizontal common voltage line HVSL is shown as a rectangle, but the present disclosure is not limited thereto. For example, the contact portion CTP of the horizontal common voltage line HVSL may have a diamond shape or a circular shape.

As shown in FIG. 10B, the first organic insulating layer 109 may be disposed on the horizontal common voltage line HVSL. The first organic insulating layer 109 may be disposed between the horizontal common voltage line HVSL and the vertical common voltage line VSL to cover the horizontal common voltage line HVSL. According to an embodiment, the first organic insulating layer 109 may cover the connection portion CNP of the horizontal common voltage line HVSL.

According to an embodiment, the display panel may further include a first island pattern CPa that is adjacent to the horizontal common voltage line HVSL, but spaced apart from the horizontal common voltage line HVSL and overlapping with the data line DL. The first island pattern CPa may be a conductive pattern including a conductive material. The first island pattern CPa may be spaced apart from the horizontal common voltage line HVSL, and may be electrically connected to the data line DL through the contact hole CNTa. The first island pattern CPa may be disposed at (e.g., in or on) the same layer (e.g., on the third inorganic insulating layer 107) as that of the horizontal common voltage line HVSL. A distance Da between the first portion HVP1 of the horizontal common voltage line HVSL and the first island pattern CPa may be equal to or substantially equal to a distance D1 between the first portion HVP1 of the horizontal common voltage line HVSL and the contact portion CTP of the horizontal common voltage line HVSL. The first island pattern CPa may not be electrically or physically connected to the horizontal common voltage line HVSL.

Figure 11:
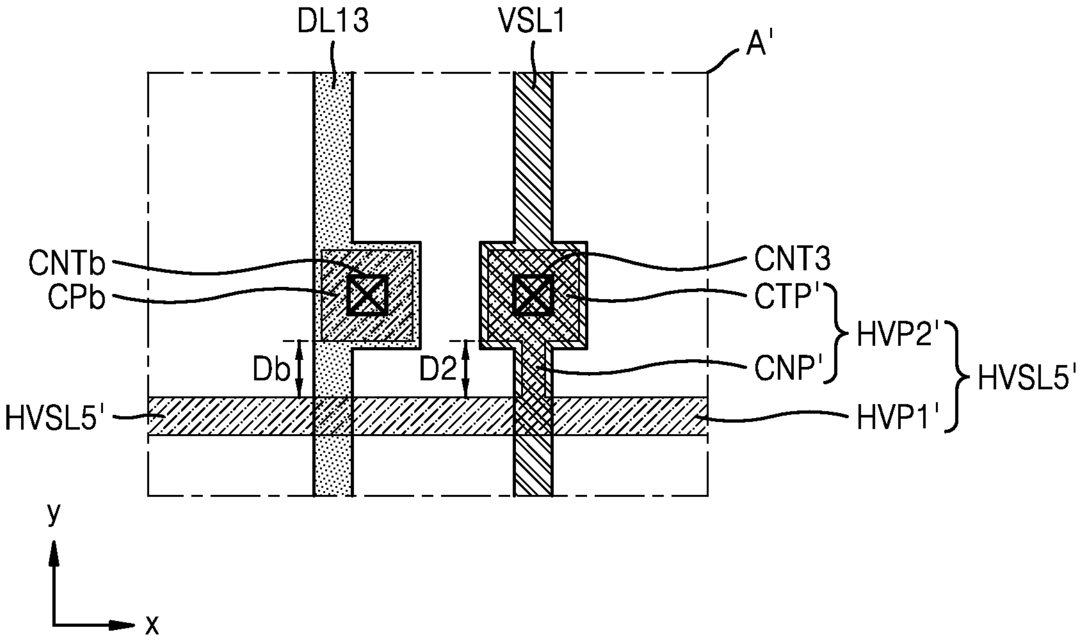
FIG. 11 is an enlarged view of the region A' of FIG. 9.

FIG. 11 is an enlarged view of the region A' of FIG. 9.

Referring to FIGS. 9 and 11, the shapes and the arrangement relationships of the vertical common voltage line VSL and the auxiliary horizontal common voltage line HVSL' in the third region R3 of the display area DA are illustrated in more detail.

The shape and the arrangement of the fifth auxiliary horizontal common voltage line HVSL5' shown in FIG. 11 may be an example of the shape and the arrangement of an auxiliary horizontal common voltage line HVSL' in a crossing area (e.g., an intersection) between the vertical common voltage line VSL and the auxiliary horizontal common voltage line HVSL'. For example, the shape and the arrangement of the fifth auxiliary horizontal common voltage line HVSL5' of FIG. 11 may be equally or substantially equally applied to the shape and the arrangement of the first auxiliary horizontal common voltage line HVSL1' in a crossing area (e.g., an intersection) between the second vertical common voltage line VSL2 and the first auxiliary horizontal common voltage line HVSL1'. For example, the shape and the arrangement of the fifth auxiliary horizontal common voltage line HVSL5' of FIG. 11 may be equally or substantially equally applied to the shape and the arrangement of the fourth auxiliary horizontal common voltage line HVSL4' and/or the sixth auxiliary horizontal common voltage line HVSL6' in a crossing area (e.g., an intersection) between the first vertical common voltage line VSL1 and the fourth auxiliary horizontal common voltage line HVSL4' and/or the sixth auxiliary horizontal common voltage line HVSL6'. For convenience, the first vertical common voltage line VSL1 and the fifth auxiliary horizontal common voltage line HVSL5' will be mainly described in more detail hereinafter.

The fifth auxiliary horizontal common voltage line HVSL5' may include a first portion HVP1' extending in the second direction (e.g., the x direction), and a second portion HVP2' protruding from the first portion HVP1' in the first direction (e.g., the y direction). At least one end of the first portion HVP1' of the fifth auxiliary horizontal common voltage line HVSL5' may be adjacent to the horizontal connection portion of the connection line CL (e.g., CL1 through CL9). The second portion HVP2' of the fifth auxiliary horizontal common voltage line HVSL5' may overlap with the first vertical common voltage line VSL1. The second portion HVP2' of the fifth auxiliary horizontal common voltage line HVSL5' may be a protrusion from the first portion HVP1'.

The fifth auxiliary horizontal common voltage line HVSL5' may be connected to the first vertical common voltage line VSL1 through the third contact hole CNT3. The second portion HVP2' of the fifth auxiliary horizontal common voltage line HVSL5' may be connected to the first vertical common voltage line VSL1 through the third contact hole CNT3. The fifth auxiliary horizontal common voltage line HVSL5' and the first vertical common voltage line VSL1 disposed at (e.g., in or on) different layers from each other may be connected to each other through the third contact hole CNT3 penetrating through at least one insulating layer (e.g., the first organic insulating layer 109 described above with reference to FIG. 4). The second portion HVP2' of the fifth auxiliary horizontal common voltage line HVSL5' may include a contact portion CTP' connected to the first vertical common voltage line VSL1 through the third contact hole CNT3, and a connection portion CNP' connecting the contact portion CTP' to the first portion HVP1' of the fifth auxiliary horizontal common voltage line HVSL5'. The connection portion CNP' of the fifth auxiliary horizontal common voltage line HVSL5' may be disposed between the first portion HVP1' of the fifth auxiliary horizontal common voltage line HVSL5' and the contact portion CTP'.

A width of the connection portion CNP' of the fifth auxiliary horizontal common voltage line HVSL5' in the second direction (e.g., the x direction) may be less than a width of the contact portion CTP' of the fifth auxiliary horizontal common voltage line HVSL5' in the second direction. In FIG. 11, the shape of the contact portion CTP' of the fifth auxiliary horizontal common voltage line HVSL5' is shown as a rectangle, but the present disclosure is not limited thereto. For example, the contact portion CTP' of the fifth auxiliary horizontal common voltage line HVSL5' may have a diamond shape, a circular shape, or the like.

The arrangement relationships of the vertical common voltage line VSL, the auxiliary horizontal common voltage line HVSL', and the organic insulating layer (e.g., the first organic insulating layer 109) in the third region R3 may be the same or substantially the same as the arrangement relationships of the vertical common voltage line VSL, the horizontal common voltage line HVSL, and the organic insulating layer (e.g., the first organic insulating layer 109). The first organic insulating layer 109 (e.g., see FIG. 4) may be disposed on the fifth auxiliary horizontal common voltage line HVSL5', similar to that shown in FIG. 10B. The first organic insulating layer 109 may be disposed between the fifth auxiliary horizontal common voltage line HVSL5 'and the first vertical common voltage line VSL1 to cover the fifth auxiliary horizontal common voltage line HVSL5'. According to an embodiment, the first organic insulating layer 109 may cover the connection portion CNP' of the fifth auxiliary horizontal common voltage line HVSL5'.

According to an embodiment, the display panel may further include a second island pattern CPb that is adjacent to the fifth auxiliary horizontal common voltage line HVSL5', but is spaced apart from the fifth auxiliary horizontal common voltage line HVSL5', and overlaps with the thirteenth data line DL13. The second island pattern CPb may be a conductive pattern including a conductive material. The second island pattern CPb may be spaced apart from the fifth auxiliary horizontal common voltage line HVSL5', and may be connected to thirteenth data line DL13 through the contact hole CNTb. The second island pattern CPb may be disposed at (e.g., in or on) the same layer as that of the fifth auxiliary horizontal common voltage line HVSL5'. A distance Db between the first portion HVP1' of the fifth auxiliary horizontal common voltage line HVSL5' and the second island pattern CPb may be equal to or substantially equal to a distance D2 between the first portion HVP1' of the fifth auxiliary horizontal common voltage line HVSL5' and the contact portion CTP' of the fifth auxiliary horizontal common voltage line HVSL5'. The second island pattern CPb may not be electrically or physically connected to the fifth auxiliary horizontal common voltage line HVSL5'.

Although the second island pattern CPb is illustrated as being disposed adjacent to a crossing area (e.g., an intersection) between the thirteenth data line DL13 and the fifth auxiliary horizontal common voltage line HVSL5', the present disclosure is not limited thereto. Thus, the display panel may include island patterns having shapes and arrangement relationships corresponding to the second island pattern CPb at other crossing areas (e.g., intersections) between each of the data lines disposed in the third region R3 and each of the auxiliary horizontal common voltage lines HVSL'.

A connection shape of the vertical common voltage line VSL and the auxiliary horizontal common voltage line HVSL' in the third region R3 may be the same or substantially the same as a connection shape of the vertical common voltage line VSL and the horizontal common voltage line HVSL in the first region R1. For example, the distance D1 between the first portion HVP1 of the horizontal common voltage line HVSL and the contact portion CTP of the horizontal common voltage line HVSL disposed in the first region R1 described above with reference to FIGS. 10A and 10B may be equal to or substantially equal to the distance D2 between the first portion HVP1' of the fifth auxiliary horizontal common voltage line HVSL5' and the contact portion CTP' of the fifth auxiliary horizontal common voltage line HVSL5' disposed in the third region R3.

Figure 12A:
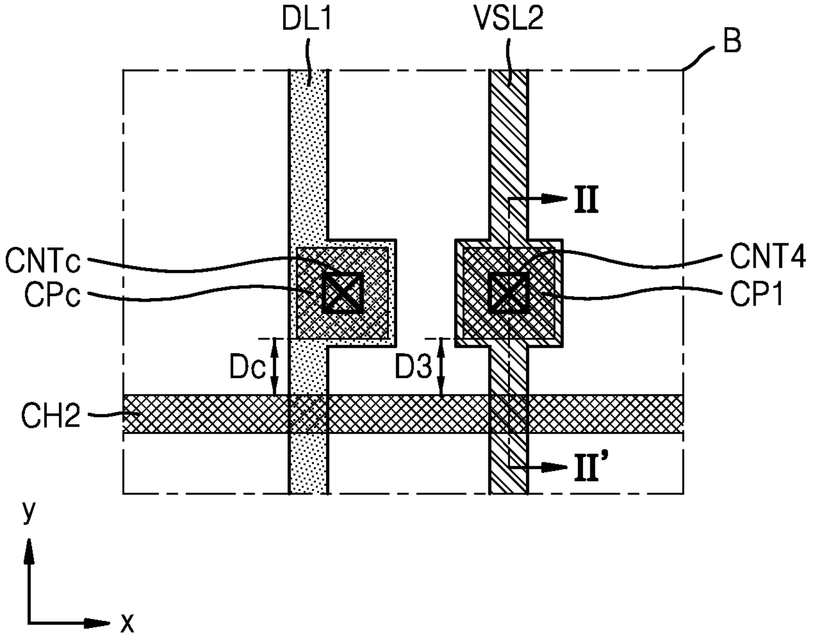
FIG. 12A is an enlarged view of the region B of FIG. 9.
Figure 12B:
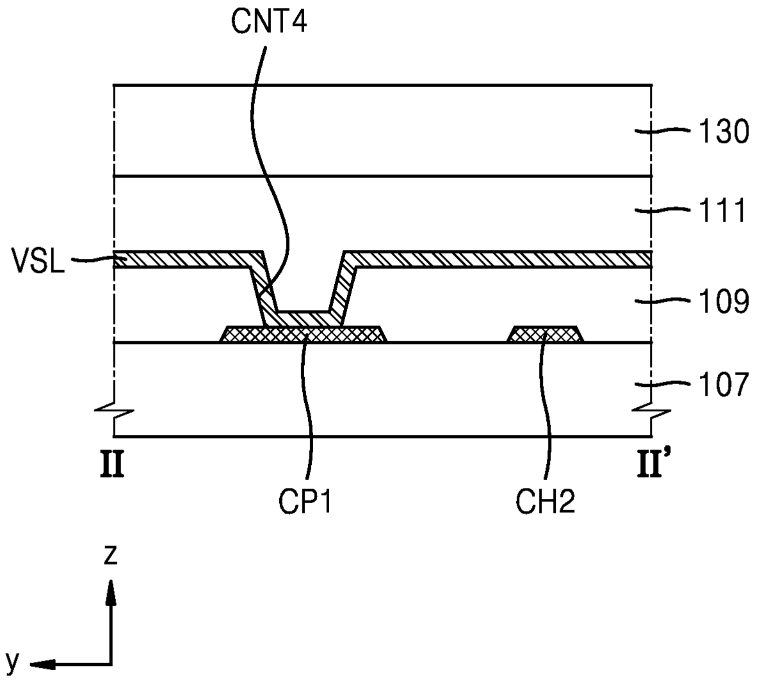
FIG. 12B is a cross-sectional view of a portion of a display panel taken along the line II-II' of FIG. 12A.

FIG. 12A is an enlarged view of the region B of FIG. 9. FIG. 12B is a cross-sectional view of a portion of a display panel taken along the line II-II' of FIG. 12A.

Referring to FIGS. 9, 12A, and 12B, arrangement relationships and shapes of the vertical common voltage line VSL and the connection line CL in the second area R2 of the display area DA are illustrated in more detail.

The display panel may further include a first conductive pattern CP1 disposed in the second area R2 of the display area DA. The first conductive pattern CP1 overlapping with the second vertical common voltage line VSL2 shown in FIGS. 12A and 12B is provided as a representative example, and thus, the first conductive pattern CP1 may also be disposed in another area adjacent to a crossing area (e.g., an intersection) between the various vertical common voltage line VSL and the various horizontal connection portions of the connection lines CL. For example, the first conductive pattern CP1 may also be disposed in an area adjacent to a crossing area (e.g., an intersection) between the second vertical common voltage line VSL2 and the third horizontal connection portion CH3 of the third connection line CL3 of FIG. 9.

The first conductive pattern CP1 may be disposed adjacent to a crossing area (e.g., an intersection) between the horizontal connection portion of the connection line CL (e.g., CL1 through CL9) and the vertical common voltage line VSL. For example, as shown in FIG. 12A, the first conductive pattern CP1 may be disposed adjacent to a crossing area (e.g., an intersection) between the second horizontal connection portion CH2 of the second connection line CL2 and the second vertical common voltage line VSL2.

The first conductive pattern CP1 may be adjacent to the horizontal connection portion of the connection line CL. The first conductive pattern CP1 may overlap with the vertical common voltage line VSL that is spaced apart from the horizontal connection portion of the connection line CL, and crosses or intersects the horizontal connection portion of the adjacent connection line CL. For example, as shown in FIG. 12A, the first conductive pattern CP1 may be adjacent to the second horizontal connection portion CH2 of the second connection line CL2, but may be spaced apart from the second horizontal connection portion CH2 of the second connection line CL2, and may overlap with the second vertical common voltage line VSL2. The first conductive pattern CP1 may not be electrically or physically connected to the second horizontal connection portion CH2 of the second connection line CL2.

The first conductive pattern CP1 may be connected to the vertical common voltage line VSL through the fourth contact hole CNT4. The first conductive pattern CP1 may be connected to the vertical common voltage line VSL crossing or intersecting the horizontal connection portion of the connection line CL. For example, as shown in FIG. 12A, the first conductive pattern CP1 may be connected to the second vertical common voltage line VSL2 through the fourth contact hole CNT4.

The first conductive pattern CP1 may be spaced apart from the connection line CL, and thus, electrically insulated from the connection line CL. For example, the first conductive pattern CP1 may be spaced apart from the second horizontal connection portion CH2 of the second connection line CL2, and thus, may be electrically insulated from the second connection line CL2.

The first conductive pattern CP1 may be disposed at (e.g., in or on) the same layer (e.g., on the third inorganic insulating layer 107) as that of the horizontal common voltage line HVSL of FIG. 10B. The first conductive pattern CP1 may be disposed at (e.g., in or on) the same layer (e.g., on the third inorganic insulating layer 107) as that of the horizontal connection portion of the connection line CL (e.g., the second horizontal connection portion CH2 of the second connection line CL2).

A distance between the horizontal connection portion of the connection line CL and the first conductive pattern CP1 adjacent to the horizontal connection portion may be equal to or substantially equal to the distance D1 between the first portion HVP1 of the horizontal common voltage line HVSL and the contact portion CTP of the horizontal common voltage line HVSL described above with reference to FIG. 10A. For example, as shown in FIG. 12A, a distance D3 between the second horizontal connection portion CH2 of the second connection line CL2 and the first conductive pattern CP1 may be equal to or substantially equal to the distance D1 between the first portion HVP1 of the horizontal common voltage line HVSL and the contact portion CTP of the horizontal common voltage line HVSL described above with reference to FIG. 10A.

In FIG. 12A, the shape of the first conductive pattern CP1 is shown as a rectangle, but the present disclosure is not limited thereto. For example, the first conductive pattern CP1 may have a diamond shape, a circular shape, or the like having vertices in the first and second directions.

According to an embodiment, the display panel may further include a third island pattern CPc that is adjacent to the second horizontal connection portion CH2 of the second connection line CL2, but is spaced apart from the second horizontal connection portion CH2 of the second connection line CL2, and overlaps with the first data line DL1. The third island pattern CPc may be a conductive pattern including a conductive material. The third island pattern CPc may be spaced apart from the second horizontal connection portion CH2 of the second connection line CL2, and may be connected to the first data line DL1 through a contact hole CNTc. The third island pattern CPc may be disposed at (e.g., in or on) the same layer as that of the second horizontal connection portion CH2 of the second connection line CL2. A distance Dc between the second horizontal connection portion CH2 of the second connection line CL2 and the third island pattern CPc may be equal to or substantially equal to the distance D3 between the second horizontal connection portion CH2 of the second connection line CL2 and the first conductive pattern CP1. The third island pattern CPC may not be electrically or physically connected to the second horizontal connection portion CH2 of the second connection line CL2.

Although the third island pattern CPc is illustrated as being disposed adjacent to a crossing area (e.g., an intersection) between the first data line DL1 and the second horizontal connection portion CH2 of the second connection line CL2, this is provided as a representative example. Thus, the display panel may include island patterns having shapes and arrangement relationships corresponding to the third island pattern CPc at other crossing areas (e.g., intersections) between each of the data lines disposed in the second region R2 and each of the connection lines CL.

According to an embodiment, as a contact hole is formed at a position corresponding to a crossing area (e.g., an intersection) between a wiring (e.g., a line) extending in the first direction and a wiring (e.g., a line) extending in the second direction, the display area DA of the display apparatus may be equally visible when viewed from the outside.

As the horizontal connection portion of the connection line CL and the first conductive pattern CP1 in the second region R2 are disposed to correspond to the arrangement relationship of the contact portion CTP of the horizontal common voltage line HVSL and the first portion HVP1 of the horizontal common voltage line HVSL in the first region R1, and the fourth contact hole CNT4 connecting the first conductive pattern CP1 to the vertical common voltage line VSL in the second region R2 is formed to correspond to the first contact hole CNT1 in the first region R1, the display area DA may be identically visible in the first region R1 and the second region R2. For example, the distance D1 from the horizontal common voltage line HVSL extending in the second direction in the first area R1 of the display area DA to the contact portion CTP of the horizontal common voltage line HVSL where the first contact hole CNT1 is located may be equal to or substantially equal to the distance D3 from a horizontal connection portion (e.g., the second horizontal connection portion CH2) of a connection line (e.g., the second connection line CL2) extending in the second direction in the second region R2 to the first conductive pattern CP1 where the fourth contact hole CNT4 is located.

Similarly, as the horizontal connection portion of the connection line CL and the first conductive pattern CP1 in the second region R2 are disposed to correspond to the arrangement relationship of the contact portion CTP' of the auxiliary horizontal common voltage line HVSL' and the first portion HVP1' of the auxiliary horizontal common voltage line HVSL' in the third region R3, and the fourth contact hole CNT4 connecting the first conductive pattern CP1 to the vertical common voltage line in the second region R2 is formed to correspond to the third contact hole CNT3 in the third region R3, the display area DA may be identically visible in the third region R3 and the second region R2. For example, the distance D2 from the auxiliary horizontal common voltage line HVSL' extending in the second direction in the third area R3 to the contact portion CTP' of the auxiliary horizontal common voltage line HVSL' where the third contact hole CNT3 is located may be equal to or substantially equal to the distance D3 from the horizontal connection portion (e.g., the second horizontal connection portion CH2) of the connection line (e.g., the second connection line CL2) extending in the second direction in the second region R2 to the first conductive pattern CP1 where the fourth contact hole CNT4 is located.

The first organic insulating layer 109 may be disposed on the horizontal connection portion of the connection line CL and the first conductive pattern CP1. For example, as shown in FIG. 12B, the first organic insulating layer 109 may be disposed on the second horizontal connection portion CH2 of the second connection line CL2 and the first conductive pattern CP1. According to an embodiment, even when the horizontal connection portion of the connection line CL and the first conductive pattern CP1 are disposed to be spaced apart from each other, an upper surface of the first organic insulating layer 109 may be flattened or substantially flattened by leveling. In other words, in the first, second, and third regions R1, R2, and R3 of the display area DA, a distance between the upper surface of the third inorganic insulating layer 107 and the upper surface of the first organic insulating layer 109 may be uniform or substantially uniform.

Figure 13:
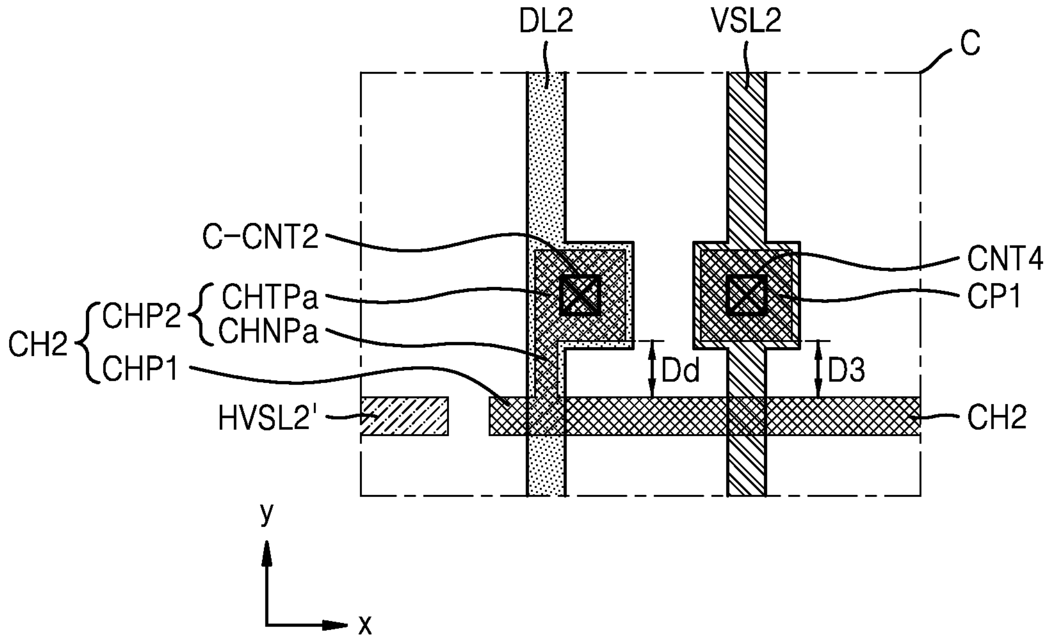
FIG. 13 is an enlarged view of the region C of FIG. 9.
Figure 14:
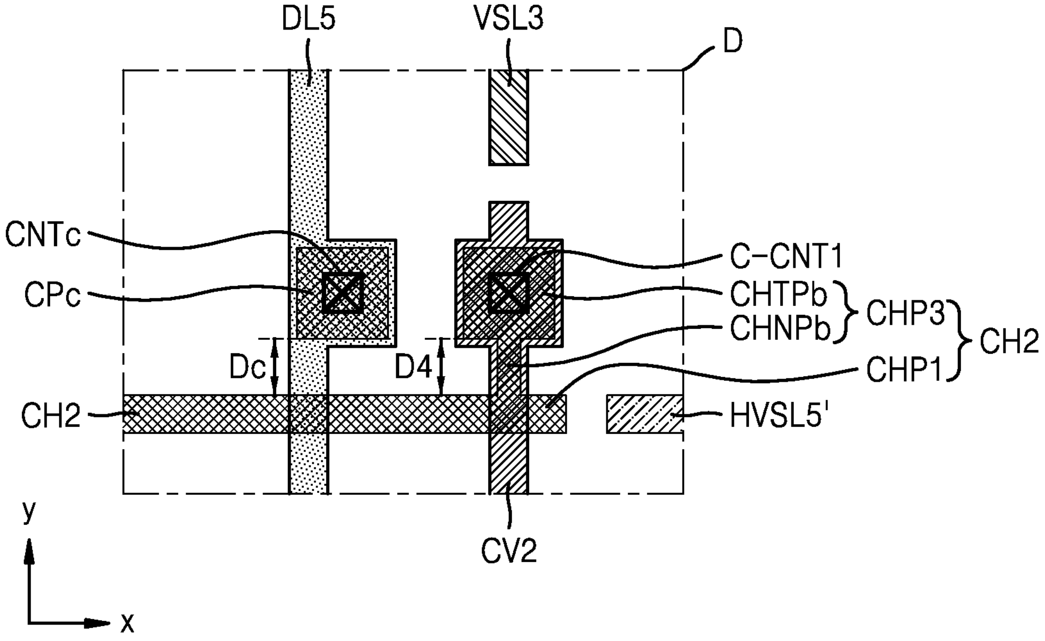
FIG. 14 is an enlarged view of the region D of FIG. 9.

FIG. 13 is an enlarged view of the region C of FIG. 9. FIG. 14 is an enlarged view of the region D of FIG. 9. FIGS. 13 and 14 show arrangement relationships between both ends of the horizontal connection portion of the connection line CL and data lines and common voltage lines in the second region R2 and shapes thereof in more detail.

The structure of the second horizontal connection portion CH2 of the second connection line CL2 shown in FIGS. 13 and 14 may be an example of the structure of the horizontal connection portion of the connection line CL in the second region R2. For example, the structure of the first horizontal connection portion CH1 of the first connection line CL1 may be the same or substantially the same as the structure of the second horizontal connection portion CH2 of the second connection line CL2 or the structure of the third horizontal connection portion CH3 of the third connection line CL3.

An arrangement relationship between one end of the second horizontal connection portion CH2 of the second connection line CL2 and the second data line DL2 shown in FIG. 13 may be an example of an arrangement relationship between one end of the horizontal connection portion of the connection line CL and the data line DL in the second region R2. For example, shapes and arrangement relationships of the first data line DL1 and one end of the first horizontal connection portion CH1 of the first connection line CL1 may be the same or substantially the same as shapes and arrangement relationships of the second data line DL2 and one end of the second horizontal connection portion CH2 of the second connection line CL2 of FIG. 13.

An arrangement relationship between another end of the second horizontal connection portion CH2 of the second connection line CL2 and the second vertical connection portion CV2 shown in FIG. 14 may be an example of an arrangement relationship between the other end of the horizontal connection portion of the connection line CL and the vertical connection portion of the connection line CL in the second region R2. For example, shapes of the other end of the first horizontal connection portion CH1 of the first connection line CL1 and the vertical connection portion CV1 of the first connection line CL1 and arrangement relationships therebetween may be the same or substantially the same as shapes of the other end of the second horizontal connection portion CH2 and the second vertical connection portion CV2 and arrangement relationships therebetween of FIG. 14. For convenience of illustration, the second data line DL2, the second horizontal connection portion CH2 of the second connection line CL2, and the third vertical common voltage line VSL3 will be mainly described in more detail hereinafter.

Because the shapes of the second vertical common voltage line VSL2 adjacent to the second data line DL2 and the second horizontal connection portion CH2 of the second connection line CL2 and arrangement relationships therebetween shown in FIG. 13 may be the same or substantially the same as the shapes of the second vertical common voltage line VSL2 adjacent to the first data line DL1 and the second horizontal connection portion CH2 of the second connection line CL2 and the arrangement relationships therebetween described above with reference to FIG. 12A, redundant description thereof may not be repeated. This is equally applicable to the respective shapes of the second vertical common voltage line VSL2 adjacent to the third data line DL3 and the third horizontal connection portion CH3 of the third connection line CL3 and the arrangement relationships therebetween, and the respective shapes of the second vertical common voltage line VSL2 adjacent to the first data line DL1 and the first horizontal connection portion CH1 of the first connection line CL1 and the arrangement relationships therebetween.

The second horizontal connection portion CH2 of the second connection line CL2 may include a first portion CHP1 extending in the second direction (e.g., the x direction), and a second portion CHP2 protruding from the first portion CHP1 in the first direction (e.g., the y direction). One end of the first portion CHP1 of the second horizontal connection portion CH2 may be disposed adjacent to the second auxiliary horizontal common voltage line HVSL2'. The second portion CHP2 of the second horizontal connection portion CH2 may overlap with the second data line DL2. The second portion CHP2 of the second horizontal connection portion CH2 may be a protrusion from the first portion CHP1.

The second horizontal connection portion CH2 of the second connection line CL2 may be connected to the second data line DL2 through the second connection contact hole C-CNT2. The second portion CHP2 of the second horizontal connection portion CH2 may be connected to the second data line DL2 through the second connection contact hole C-CNT2. The second horizontal connection portion CH2 and the second data line DL2 disposed at (e.g., in or on) different layers from each other may be connected to each other through the second connection contact hole C-CNT2 penetrating through at least one insulating layer, for example, such as the first organic insulating layer 109 of FIG. 4. The second portion CHP2 of the second horizontal connection portion CH2 may include a contact portion CHTPa connected to the second data line DL2 through the second connection contact hole C-CNT2, and a connection portion CHNPa connecting the contact portion CHTPa to the first portion CHP1 of the second horizontal connection portion CH2.

A width of the connection portion CHNPa of the second portion CHP2 of the second horizontal connection portion CH2 in the second direction (e.g., the x direction) may be less than a width of the contact portion CHTPa of the second portion CHP2 of the second horizontal connection portion CH2 in the second direction. In FIG. 13, the shape of the contact portion CHTPa of the second portion CHP2 of the second horizontal connection portion CH2 is shown as a rectangle, but the present disclosure is not limited thereto. For example, the contact portion CHTPa of the second portion CHP2 of the second horizontal connection portion CH2 may have a diamond shape, a circular shape, or the like.

As shown in FIG. 13, a distance Dd between the first portion CHP1 of the second horizontal connection portion CH2 and the contact portion CHTPa of the second portion CHP2 of the second horizontal connection portion CH2 may be the same or substantially the same as the distance D3 between the first portion CHP1 of the second horizontal connection portion CH2 and the first conductive pattern CP1. The distance Dd between the first portion CHP1 of the second horizontal connection portion CH2 and the contact portion CHTPa of the second portion CHP2 of the second horizontal connection portion CH2 may be the same or substantially the same as the distance Da between the first portion HVP1 of the horizontal common voltage line HVSL and the first island pattern CPa described above with reference to FIG. 10A. The distance Dd between the first portion CHP1 of the second horizontal connection portion CH2 and the contact portion CHTPa of the second portion CHP2 of the second horizontal connection portion CH2 may be the same or substantially the same as the distance Db between the first portion HVP1' of the fifth auxiliary horizontal common voltage line HVSL5' and the second island pattern CPb described above with reference to FIG. 11. The distance Dd between the first portion CHP1 of the second horizontal connection portion CH2 and the contact portion CHTPa of the second portion CHP2 of the second horizontal connection portion CH2 may be the same or substantially the same as the distance Dc between the second horizontal connection portion CH2 of the second connection line CL2 and the third island pattern CPc described above with reference to FIG. 12A.

The third island pattern CPc adjacent to the second horizontal connection portion CH2 and overlapping with the fifth data line DL5 shown in FIG. 14 is the same or substantially the same as the third island pattern CPc described above with reference to FIG. 12, and thus, redundant description thereof may not be repeated.

The second horizontal connection portion CH2 of the second connection line CL2 may include a first portion CHP1 extending in the second direction (e.g., the x direction), and a third portion CHP3 protruding from the first portion CHP1 in the first direction (e.g., the y direction). The other end of the first portion CHP1 of the second horizontal connection portion CH2 may be disposed adjacent to the fifth auxiliary horizontal common voltage line HVSL5'. The third portion CHP3 of the second horizontal connection portion CH2 may overlap with the second vertical connection portion CV2. The third portion CHP3 of the second horizontal connection portion CH2 may be a protrusion from the first portion CHP1. The second portion CHP2 (e.g., see FIG. 13) and the third portion CHP3 (e.g., see FIG. 14) of the second horizontal connection portion CH2 may be disposed on opposite ends of the second horizontal connection portion CH2, respectively. In other words, the second portion CHP2 of the second horizontal connection portion CH2 may be disposed on one end of the first portion CHP1 of the second horizontal connection portion CH2, and the third portion CHP3 of the second horizontal connection portion CH2 may be disposed on the other end of the first portion CHP1 of the second horizontal connection portion CH2.

The second horizontal connection portion CH2 of the second connection line CL2 may be connected to the second vertical connection portion CV2 through the first connection contact hole C-CNT1. The third portion CHP3 of the second horizontal connection portion CH2 may be connected to the second vertical connection portion CV2 through the first connection contact hole C-CNT1. The second horizontal connection portion CH2 and the second vertical connection portion CV2 disposed at (e.g., in or on) different layers from each other may be connected to each other through the first connection contact hole C-CNT1 penetrating through at least one insulating layer, for example, such as the first organic insulating layer 109 of FIG. 4. The third portion CHP3 of the second horizontal connection portion CH2 may include a contact portion CHTPb connected to the second vertical connection portion CV2 through the first connection contact hole C-CNT1, and a connection portion CHNPb connecting the contact portion CHTPb to the first portion CHP1 of the second horizontal connection portion CH2.

A width of the connection portion CHNPb of the third portion CHP3 of the second horizontal connection portion CH2 in the second direction (e.g., the x direction) may be less than a width of the contact portion CHTPb of the third portion CHP3 of the second horizontal connection portion CH2 in the second direction. In FIG. 14, the shape of the contact portion CHTPb of the third portion CHP3 of the second horizontal connection portion CH2 is shown as a rectangle, but the present disclosure is not limited thereto. For example, the contact portion CHTPb of the third portion CHP3 of the second horizontal connection portion CH2 may have a diamond shape, a circular shape, or the like.

As shown in FIG. 14, a distance D4 between the first portion CHP1 of the second horizontal connection portion CH2 and the contact portion CHTPb of the third portion CHP3 of the second horizontal connection portion CH2 may be the same or substantially the same as the distance Dc between the first portion CHP1 of the second horizontal connection portion CH2 and the third island pattern CPc overlapping with the fifth data line DL5. The distance D4 between the first portion CHP1 of the second horizontal connection portion CH2 and the contact portion CHTPb of the third portion CHP3 of the second horizontal connection portion CH2 may be the same substantially the same as the distance D1 between the first portion HVP1 of the horizontal common voltage line HVSL and the first contact portion CTP of the horizontal common voltage line HVSL described above with reference to FIG. 10A.

Figure 15:
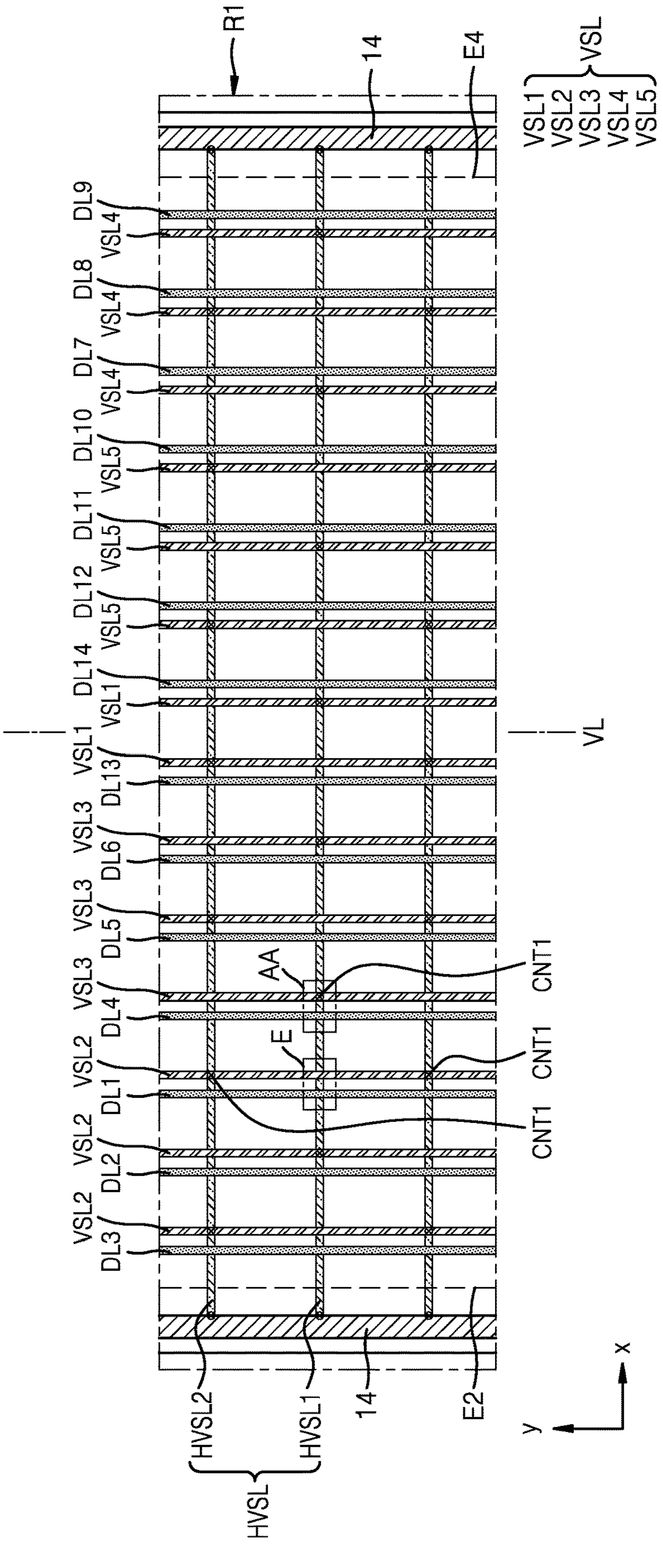
FIG. 15 is an enlarged plan view of a portion of a first region of FIG. 5, according to an embodiment.
Figure 16:
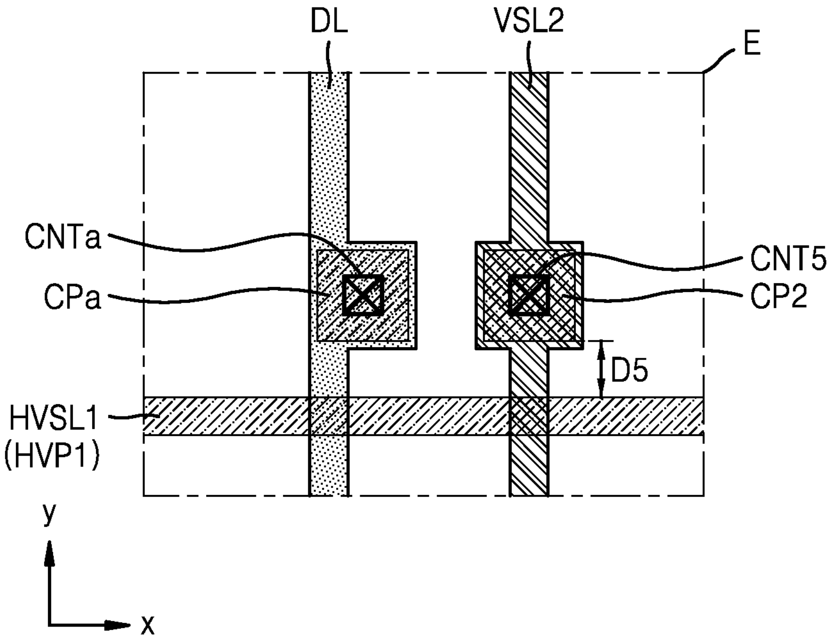
FIG. 16 is an enlarged view of the region E of FIG. 15.

FIG. 15 is an enlarged plan view of a portion of the first region R1 of FIG. 5, according to an embodiment. The embodiment of FIG. 15 may be different from the embodiment described above with reference to FIG. 8, and illustrates the first contact hole CNT1 disposed in some of the regions where the vertical common voltage line VSL crosses or intersects the horizontal common voltage line HVSL. FIG. 16 is an enlarged view of the region E of FIG. 15.

Referring to FIGS. 15 and 16, in the first region R1 of the display area DA, the horizontal common voltage line HVSL may include the first horizontal common voltage line HVSL1 and the second horizontal common voltage line HVSL2 adjacent to each other in the second direction (e.g., the y direction). Because a region AA in FIG. 15 has the same or substantially the same structure as that of the region A in FIG. 8, redundant description thereof may not be repeated. In FIG. 16, the first island pattern CPa overlapping with the data line DL crossing or intersecting the first horizontal common voltage line HVSL1 may be the same or substantially the same as that described above with reference to FIG. 10A, and thus, redundant description thereof may not be repeated.

The first horizontal common voltage line HVSL1 may be electrically connected to the third vertical common voltage line VSL3 through the first contact hole CNT1. The first horizontal common voltage line HVSL1 may include the second portion HVP2 protruding from the first portion HVP1 extending in the second direction, as shown in FIG. 10A, in a crossing area (e.g., an intersection) with the third vertical common voltage line VSL3.

FIG. 16 illustrates a crossing area (e.g., an intersection) between the first horizontal common voltage line HVSL1 and the second vertical common voltage line VSL2 adjacent to the third vertical common voltage line VSL3.

The display panel may further include a second conductive pattern CP2 disposed in the first area R1 of the display area DA. The second conductive pattern CP2 overlapping with the second vertical common voltage line VSL2 shown in FIG. 16 is provided as a representative example, and thus, the second conductive pattern CP2 may also be disposed in another crossing area (e.g., intersection) between various vertical common voltage lines VSL and various horizontal common voltage lines HVSL. According to an embodiment, the second conductive pattern CP2 may be disposed at a crossing area (e.g., an intersection) between the horizontal common voltage line HVSL not connected to the vertical common voltage line VSL through the first contact hole CNT1 and the vertical common voltage line VSL.

The second conductive pattern CP2 may be disposed adjacent to the crossing area (e.g., the intersection) between the first horizontal common voltage line HVSL1 and the second vertical common voltage line VSL2 adjacent to the third vertical common voltage line VSL3. The second conductive pattern CP2 may overlap with the second vertical common voltage line VSL2 adjacent to the third vertical common voltage line VSL3. The second conductive pattern CP2 may be connected to the second vertical common voltage line VSL2 through the fifth contact hole CNT5. The second conductive pattern CP2 may be spaced apart from the first horizontal common voltage line HVSL1, and thus, may be electrically insulated from the first horizontal common voltage line HVSL1. The second conductive pattern CP2 may be disposed at (e.g., in or on) the same layer as that of the horizontal common voltage line HVSL.

A distance D5 between the first portion HVP1 of the first horizontal common voltage line HVSL1 and the second conductive pattern CP2 may be equal to or substantially equal to the distance D1 between the first portion HVP1 of the horizontal common voltage line HVSL and the contact portion CTP of the horizontal common voltage line HVSL described above with reference to FIG. 10B. The distance D5 between the first portion HVP1 of the first horizontal common voltage line HVSL1 and the second conductive pattern CP2 may be equal to or substantially equal to the distance D1 between the horizontal connection portion of the connection line CL and the first conductive pattern CP1 adjacent to the horizontal connection portion described above with reference to FIG. 12B. The second conductive pattern CP2 may have the same or substantially the same shape as that of the first conductive pattern CP1.

In FIG. 15, a crossing area (e.g., an intersection) between the vertical common voltage line VSL and the horizontal common voltage line HVSL where the first contact hole CNT1 is disposed, and a crossing area (e.g., an intersection) between the vertical common voltage line VSL and the horizontal common voltage line HVSL where the first contact hole CNT1 is not disposed are illustrated as being alternately disposed along the second direction. However, the present disclosure is not limited thereto. The numbers of first contact holes CNT1 and second conductive patterns CP2 in the first region R1 and the arrangements thereof may be variously modified as needed or desired. For example, a ratio of the number of first contact holes CNT1 to the number of second conductive patterns CP2 in the first region R1 may be variously modified to be 1:1, 2:1, 3:1, 4:1, or the like.

According to an embodiment, because the display apparatus includes the second portion HPV2 of the horizontal common voltage line HVSL where the first contact hole CNT1 is located and the second conductive pattern CP2 together in the first region R1 of the display area DA, a difference in visibility between the first region R1 and the second region R2 of the display area DA may be reduced, and thus, the display quality of the display apparatus may be improved.

According to an embodiment, a display apparatus capable of displaying a high-resolution image by reducing a difference in visibility between regions of a display area may be realized. However, the aspects and features of the present disclosure are not limited thereto.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:

a substrate comprising a display area, and a peripheral area outside the display area;

a common voltage supply line on the peripheral area, and surrounding at least a portion of the display area;

vertical common voltage lines, each extending in a first direction on the display area, and electrically connected to the common voltage supply line;

horizontal common voltage lines, each extending in a second direction crossing the first direction on the display area, and electrically connected to the common voltage supply line;

data input lines on the peripheral area;

data lines, each extending in the first direction on the display area, and located along the second direction;

connection lines on the display area, and connecting the data input lines to the data lines, respectively, each of the connection lines comprising:

a vertical connection portion extending in the first direction; and a horizontal connection portion extending in the second direction; and a first conductive pattern at the same layer as that of the horizontal common voltage lines, the first conductive pattern being spaced from the horizontal connection portion of a first connection line from among the connection lines, and connected to a first vertical common voltage line crossing the horizontal connection portion of the first connection line from among the vertical common voltage lines through a contact hole.

2. The display apparatus of claim 1, wherein the first conductive pattern is located adjacent to a crossing area between the horizontal connection portion of the first connection line and the first vertical common voltage line.

3. The display apparatus of claim 1, wherein the first conductive pattern is located at the same layer as that of the horizontal connection portion of the first connection line.

4. The display apparatus of claim 1, wherein the first conductive pattern is electrically insulated from the first connection line.

5. The display apparatus of claim 1, wherein:

a first horizontal common voltage line from among the horizontal common voltage lines comprises:

a first portion extending in the second direction; and a second portion protruding in the first direction from the first portion of the first horizontal common voltage line; and the second portion of the first horizontal common voltage line is connected to a second vertical common voltage line from among the vertical common voltage lines through a contact hole.

6. The display apparatus of claim 5, wherein the second portion of the first horizontal common voltage line comprises:

a contact portion connected to the second vertical common voltage line; and a connection portion connecting the contact portion to the first portion of the first horizontal common voltage line.

7. The display apparatus of claim 6, wherein a distance between the horizontal connection portion of the first connection line and the first conductive pattern is substantially equal to a distance between the first portion of the first horizontal common voltage line and the contact portion of the first horizontal common voltage line.

8. The display apparatus of claim 6, further comprising a second conductive pattern adjacent to a portion at which the first horizontal common voltage line and a third vertical common voltage line adjacent to the second vertical common voltage line from among the vertical common voltage lines cross each other, the second conductive pattern being located at the same layer as that of the horizontal common voltage lines, and connected to the third vertical common voltage line through a contact hole.

9. The display apparatus of claim 8, wherein the second conductive pattern is electrically insulated from the first horizontal common voltage line.

10. The display apparatus of claim 8, wherein a distance between the first portion of the first horizontal common voltage line and the second conductive pattern is substantially equal to a distance between the first portion of the first horizontal common voltage line and the contact portion of the first horizontal common voltage line.

11. The display apparatus of claim 1, further comprising auxiliary horizontal common voltage lines, each extending in the second direction on the display area, and having lengths less than that of the horizontal common voltage lines.

12. The display apparatus of claim 11, wherein:

each of the auxiliary horizontal common voltage lines comprises:

a first portion extending in the second direction; and a second portion protruding in the first direction from the first portion of the auxiliary horizontal common voltage lines; and the second portion of one of the auxiliary horizontal common voltage lines is connected to a fourth vertical common voltage line from among the vertical common voltage lines through a contact hole.

13. The display apparatus of claim 1, wherein:

the horizontal connection portion of a first connection line from among the connection lines comprises:

a first portion extending in the second direction; and a second portion on one end of the first portion of the horizontal connection portion and protruding in the first direction; and the second portion of the horizontal connection portion is connected to one data line from among the data lines through a contact hole.

14. The display apparatus of claim 13, wherein:

the horizontal connection portion of the first connection line further comprises a third portion on another end of the first portion, and protruding in the first direction; and the third portion of the horizontal connection portion is connected to the vertical connection portion of the first connection line through a contact hole.

15. The display apparatus of claim 1, wherein the horizontal common voltage lines and the horizontal connection portions of the connection lines are located at the same layer as each other.

16. The display apparatus of claim 1, wherein the common voltage supply line comprises:

a first common voltage input portion;

a second common voltage input portion; and a third common voltage input portion between the first common voltage input portion and the second common voltage input portion, and wherein each of the first, second, and third common voltage input portions is located adjacent to a first edge of the display area.

17. A display apparatus comprising:

a substrate comprising a display area, and a peripheral area outside the display area;

a common voltage supply line on the peripheral area, and surrounding at least a portion of the display area;

vertical common voltage lines, each extending in a first direction on the display area, and electrically connected to the common voltage supply line;

horizontal common voltage lines, each extending in a second direction crossing the first direction on the display area, and electrically connected to the common voltage supply line;

data input lines on the peripheral area;

data lines, each extending in the first direction on the display area; and connection lines in the display area, and connecting the data input lines to the data lines, respectively, each of the connection lines comprising:

a vertical connection portion extending in the first direction; and a horizontal connection portion extending in the second direction, wherein:

the display area comprises a first region where the vertical common voltage lines cross the horizontal common voltage lines, and a second region where the vertical common voltage lines cross the horizontal connection portions of the connection lines; and the display apparatus further comprises a first conductive pattern in the second region, electrically insulated from the connection lines, and connected to a first vertical common voltage line from among the vertical common voltage lines through a contact hole.

18. The display apparatus of claim 17, wherein:

a first horizontal common voltage line from among the horizontal common voltage lines located in the first region comprises:

a first portion extending in the second direction; and a second portion protruding in the first direction from the first portion of the first horizontal common voltage line; and the second portion of the first horizontal common voltage line is connected to a second vertical common voltage line from among the vertical common voltage lines through a contact hole.

19. The display apparatus of claim 18, wherein the second portion of the first horizontal common voltage line comprises:

a contact portion connected to the second vertical common voltage line; and a connection portion connecting the contact portion to the first portion of the first horizontal common voltage line.

20. The display apparatus of claim 19, wherein:

the first conductive pattern is adjacent to the horizontal connection portion of a first connection line from among the connection lines; and a distance between the horizontal connection portion of the first connection line and the first conductive pattern is substantially equal to a distance between the first portion of the first horizontal common voltage line and the contact portion of the first horizontal common voltage line.

21. The display apparatus of claim 17, wherein:

the display area further comprises a third region;

the display apparatus further comprises auxiliary horizontal common voltage lines, each extending in the second direction on the third region of the display area, and having lengths less than that of the horizontal common voltage lines;

each of the auxiliary horizontal common voltage lines comprises:

a first portion extending in the second direction; and a second portion protruding in the first direction from the first portion of the auxiliary horizontal common voltage lines; and the second portion of one of the auxiliary horizontal common voltage lines is connected to a third vertical common voltage line from among the vertical common voltage lines through a contact hole.

22. The display apparatus of claim 21, wherein the second portion of the one of the auxiliary horizontal common voltage lines comprises:

a contact portion connected to the third vertical common voltage line; and a connection portion connecting the contact portion to the first portion of the one of the auxiliary horizontal common voltage lines.

23. The display apparatus of claim 22, wherein:

the first conductive pattern is adjacent to the horizontal connection portion of a first connection line from among the connection lines; and a distance between the horizontal connection portion of the first connection line and the first conductive pattern is substantially equal to a distance between the first portion of the one of the auxiliary horizontal common voltage lines and the contact portion of the one of the auxiliary horizontal common voltage lines.

24. A display apparatus comprising:
a substrate comprising a display area, and a peripheral area outside the display area;
a common voltage supply line on the peripheral area, and surrounding at least a portion of the display area;
a vertical common voltage line extending in a first direction on the display area, and electrically connected to the common voltage supply line;
a horizontal common voltage line extending in a second direction crossing the first direction on the display area, and electrically connected to the common voltage supply line;
a data line extending in the first direction on the display area;
a connection line comprising:
a horizontal connection portion on the display area, connected to the data line through a contact hole, and extending in the second direction; and
a vertical connection portion connected to the horizontal connection portion through a contact hole, and extending in the first direction; and
a conductive pattern spaced from the horizontal connection portion of the connection line, and connected to the vertical common voltage line through a contact hole,
wherein the horizontal common voltage line comprises a contact portion connected to the vertical common voltage line by a contact hole, and
wherein a distance between the horizontal common voltage line and the contact portion is substantially equal to a distance between the horizontal connection portion and the conductive pattern.

* * * * *